United States Patent [19]

Kumata et al.

[11] Patent Number: 5,619,157

[45] Date of Patent: Apr. 8, 1997

[54] SYNCHRONIZING CIRCUIT WITH DYNAMIC AND STATIC LATCH CIRCUITRY

[75] Inventors: Ichiro Kumata; Takeshi Onodera; Takenori Sugawara, all of Kanagawa, Japan

[73] Assignee: Sony Corporation, Japan

[21] Appl. No.: 352,840

[22] Filed: Dec. 2, 1994

[30] Foreign Application Priority Data

Dec. 14, 1993 [JP] Japan .................................. 5-313706
Jan. 18, 1994 [JP] Japan .................................. 6-003636
Mar. 31, 1994 [JP] Japan .................................. 6-063807

[51] Int. Cl.[6] .......................... H03K 3/355; G11C 19/28
[52] U.S. Cl. .......................... 327/203; 327/199; 327/215; 327/218; 377/78; 377/117; 326/93
[58] Field of Search .................................. 327/202, 200, 327/199, 203, 219, 218, 215, 155, 141; 377/78, 79, 75, 105, 117, 115; 326/93

[56] References Cited

U.S. PATENT DOCUMENTS

| | | | |
|---|---|---|---|
| 3,993,916 | 11/1976 | Copeland, III et al. ............... | 377/79 |
| 4,554,664 | 11/1985 | Schultz ..................... | 371/25 |
| 4,843,254 | 6/1989 | Motegi et al. ..................... | 327/203 |
| 5,012,246 | 4/1991 | Chung et al. ..................... | 341/160 |
| 5,157,627 | 10/1992 | Gheewala ..................... | 365/189.03 |
| 5,179,534 | 1/1993 | Pierce et al. ..................... | 365/189.01 |
| 5,349,255 | 9/1994 | Patel ..................... | 327/141 |
| 5,457,698 | 10/1995 | Segawa et al. ..................... | 371/223 |
| 5,459,421 | 10/1995 | Shaw ..................... | 327/203 |

FOREIGN PATENT DOCUMENTS 590913  9/1993  Japan .................................. 327/203

Primary Examiner—Timothy P. Callahan
Assistant Examiner—Terry L. Englund
Attorney, Agent, or Firm—Ronald P. Kananen

[57] ABSTRACT

A synchronizing circuit including a plurality of latches, comprised of a first dynamic type through latch circuit and a second dynamic type through latch circuit between which is disposed a static type through latch circuit, the circuits connected in cascade. Data is sampled at the timing of the rising edge of the clock signal generated by a pulse generation circuit connected to a clock input circuit and data is output at the timing of the trailing edge. By defining the clock pulse width generated at the pulse generation circuit larger than the clock skew, it is possible to prevent malfunctions of the LSI caused by clock skew caused by deviation of timing of the clock distribution. Moreover, by providing a dynamic type through circuit for a scan test input to the first dynamic type through latch circuit in parallel, a scanning function can be realized and a malfunction due to the clock skew during scanning can be prevented.

9 Claims, 24 Drawing Sheets

FIG. 14A  D  
FIG. 14B  CKP  
FIG. 14C  SCK  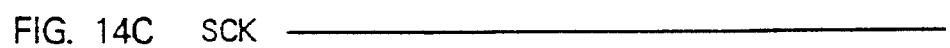
FIG. 14D  Nsc  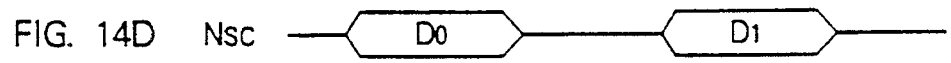
FIG. 14E  N4  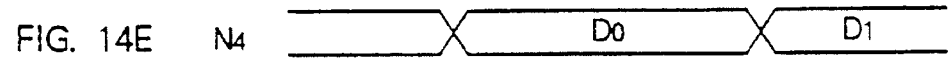
FIG. 14F  Q  
FIG. 15A  D  
FIG. 15B  CKP  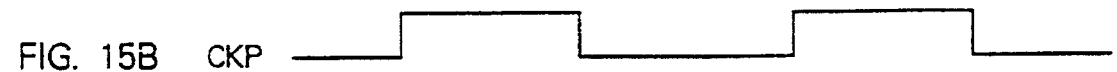
FIG. 15C  SC  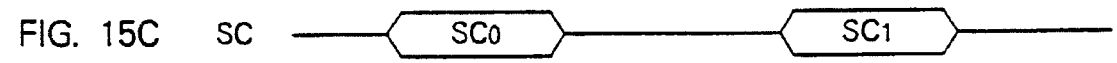
FIG. 15D  SCK  
FIG. 15E  Nsc  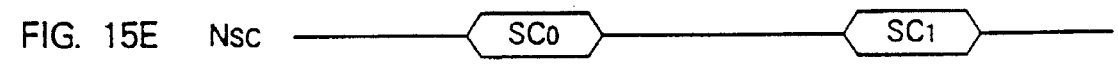
FIG. 15F  N4  
FIG. 15G  Q  

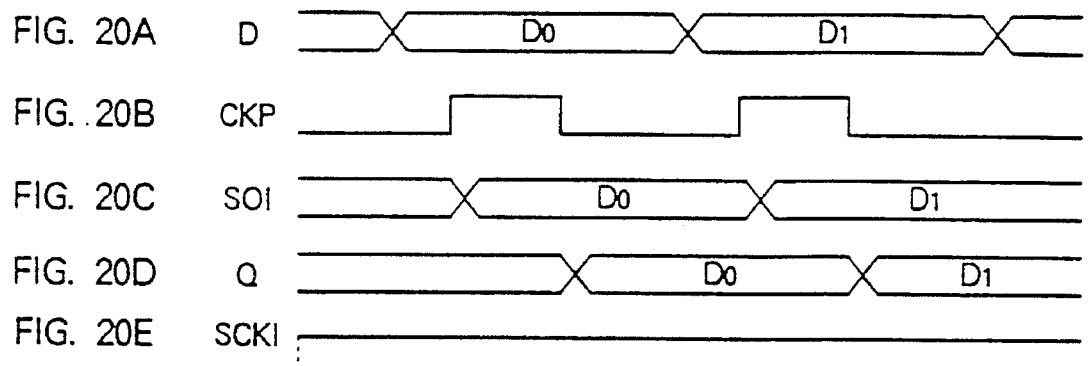
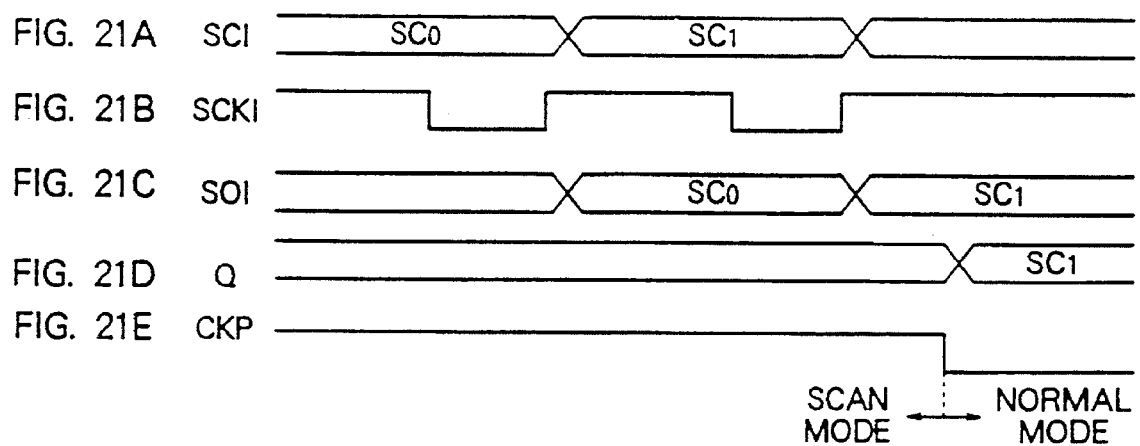

FIG. 28A    D   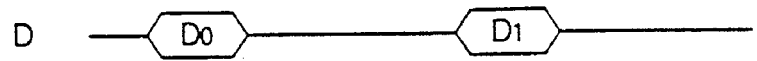
FIG. 28B    CKP 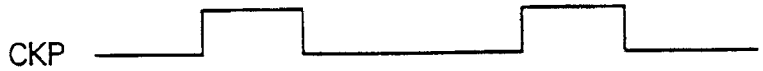
FIG. 28C    Pm  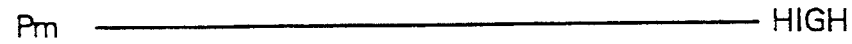 HIGH
FIG. 28D    Si  ———————————————— LOW
FIG. 28E    Q   
FIG. 29A    D   ———————————————— LOW
FIG. 29B    CKP 
FIG. 29C    Pm  
FIG. 29D    Si  
FIG. 29E    Q   

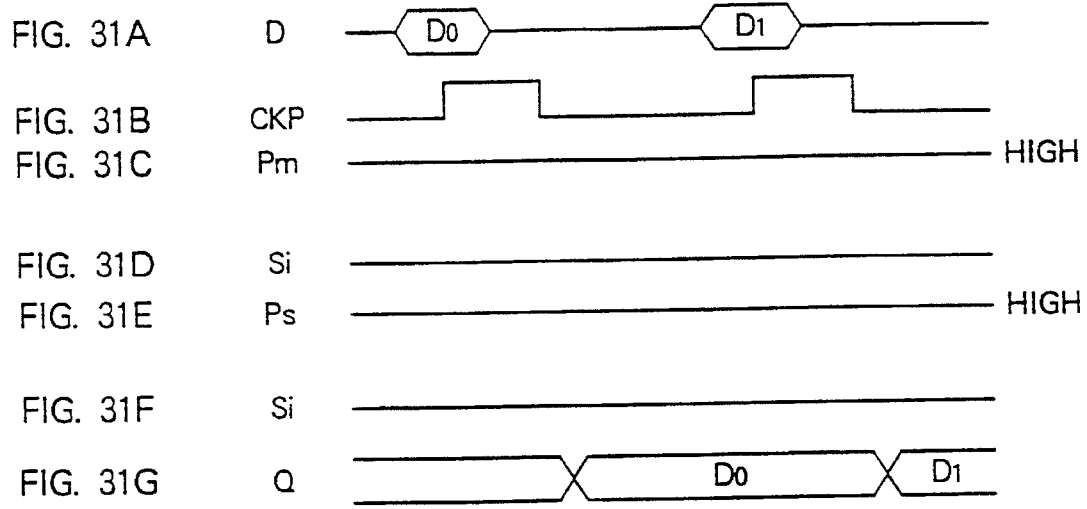
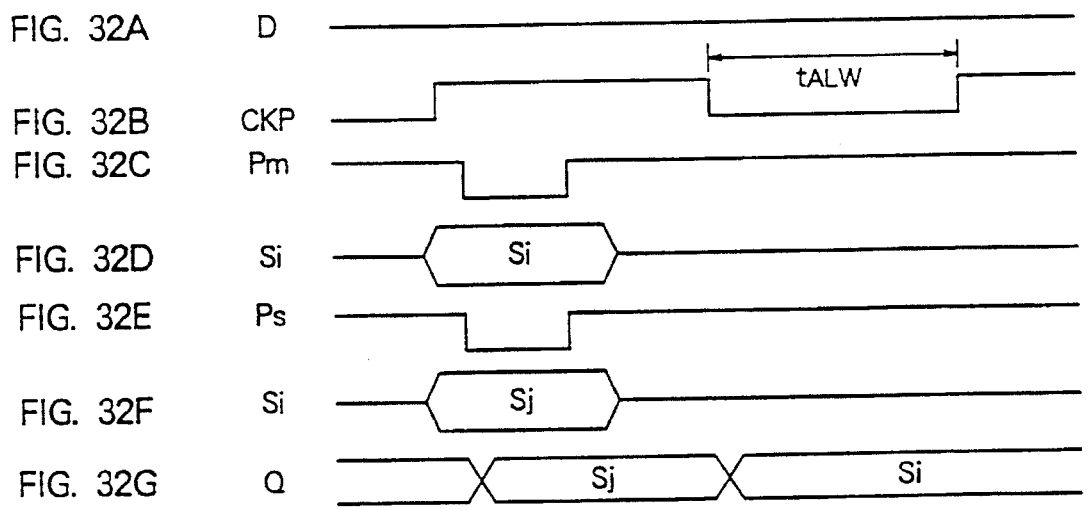

SYNCHRONIZING CIRCUIT WITH DYNAMIC AND STATIC LATCH CIRCUITRY

BACKGROUND OF THE INVENTION

1. Field of the Invention

The present invention relates to a synchronizing circuit applied to a sequence circuit etc. used in a large-scale integrated circuit etc.

2. Description of the Related Art

When realizing a logic circuit, in particular a sequence circuit which operates in synchronization with a clock such as an LSI circuit, a common design practice at the present time is to use a single-phase clock and delay type (D)-flipflops.

AS LSIs have become larger in scale, the delay time due to distribution of a clock signal has increased, and the use of frequency-divided clock signals and gated clock signals has led to deviations in timing of clock signals at ends of devices, that is, the clock skew has become greater, the possibility rises that the holding time of the D-flipflop will not be met and a malfunction will occur.

For example, in a 0.7 μm rule CMOS, the maximum value of the clock skew is required to be on the order of 0.5 nsec. It is not easy to satisfy this requirement with a circuit of a size of over 100,000 gates.

Various attempts have been made, for example, tinkering with the clock interconnections, so as to overcome this disadvantage and to reduce the clock skew on the layout, as proposed in various references such as Baifukan, Ultrahigh Speed Digital Device Series 2, "Ultrahigh Speed MOS Devices", pp. 241 to 244"; Data Processing Society, 43rd (1991) National Conference (3R-8), "Clock Skew Minimization Interconnection Methods", Toshiba ULSI Institute; Data Processing Society, 43rd (1991) National Conference (3R-7), "Clock Skew Management Layout Methods", Oki Electric USLI Development Center; Shingaku Technical Reports IDC89-191, "0.8 μm CMOS SOG With High Performance Clock Allocation Function", Mitsubishi Electric LSI Institute; NEC Technical Reports, Vol. 45, No. 8/1992, "Open CAD Clock Tree Synthesis", NEC ULSI System Development Institute).

The above-mentioned proposed circuits, however, still suffer from the following disadvantages.

When desiring to reuse an existing layout for each block, it is necessary to change the buffer configuration and cell deployment of the clock signal processing system to balance the chip as a whole, so in the final analysis in many cases the design has to be redone from the beginning.

Further, as processes become more advanced and the operating speed and number of gates increase, the requirements will become increasingly severe and there is a high possibility that they will not be able to be met.

In addition, other measures are necessary when using a frequency-divided clock signal or gated clock signal, which may be used in large-sized LSIs.

Further, basically, to overcome these advantages, the design technique has been known making use of a two-phase non-overlap clock signal and through latch as one full-custom design method, but the applications of this are limited due to the fact that two systems of clock signals are required and there are other troublesome facets of design or difficulty in verifying the maximum operating speed.

As shown in FIG. 1, even in a design using a single phase clock signal and D-flipflops $DFF_1$ $DFF_3$..., a similar effect can be achieved. $INV_1$ and $INV_2$ show inverters comprising a clock input portion, and CIR shows a combination circuit arranged between the adjacent D-flipflops DFF. In this configuration, however, the number of D-flipflops ends up being doubled.

Further, as shown in FIG. 2, it is also effective if use is made of a single-phase clock signal and D-flipflops $DFF_4$ and $DFF_5$ and a delay gate comprised of the inverters $INV_3$ to $INV_6$ for example is inserted between the data output terminal Q of the D-flipflop $DFF_4$ and the data input terminal D of the D-flipflop $DFF_5$ or such a delay gate is created and attached to the D-flipflop DFF cell. In such a configuration, however, the number of gates or the cell area greatly increases.

Another disadvantage accompanying the increasing size of LSIs is the testing of the LSIs. Among the methods known for facilitating LSI tests, there is the scanning method of providing selectors before each input of the D-flipflop to construct a scanning circuit, as well as the cross check method of using lattice-like buried test circuits in the gate array. With these simplified test circuits, however, the additional test function causes the area of the D-flipflop to greatly increase.

SUMMARY OF THE INVENTION

An object of the present invention is to provide a synchronizing circuit which can prevent malfunctions due to deviations in timing of the distributed clock signals with just a slight increase in the number of gates and reduction in the operating speed and which can facilitate testing.

To achieve the above object, a synchronizing circuit of the present invention is provided with a latch circuit for receiving, as input, data at a point of change from a first level of a clock signal to a second level and outputting data at a point of change from the second level to the first level.

The latch circuit is preferably comprised of a first dynamic type latch circuit and static type latch circuits connected in cascade.

Alternatively, it may be comprised of a first dynamic type latch circuit, a second dynamic type latch circuit, and static type latch circuits. The static type latch circuits are sandwiched between the first dynamic type latch circuit and the second dynamic type latch circuit and the circuits are connected in cascade.

There may be further provided a pulse generating circuit for generating a clock signal limited in its pulse width for a predetermined time and outputting the same to the latch circuit.

According to the present invention, for example, a clock signal limited in pulse width for a predetermined time is generated at the pulse generation circuit and the generated clock signal is input to a latch circuit. At the latch circuit, data is input at the point of change from a first level of the input clock signal to a second level and data is output at the point of change from the second level to the first level. As a result, the circuit can operate normally even if there is a clock skew of the amount of the pulse width of the clock signal generated by the pulse generation circuit. If the pulse width is wider than the clock skew and is sufficiently shorter than the clock cycle time, there is almost no reduction in the operating speed and the occurrence of a malfunction by clock skew is prevented even during a scan operation.

The data holding time of the dynamic type latch circuit is determined by the pulse width of the input clock signal.

There may be further provided a test signal input unit for inputting a test signal into the first dynamic type latch circuit. For example, during the scan path test mode, a scan test signal is input through the test signal input unit to the first dynamic type latch circuit.

Also, there may be provided a third dynamic type latch circuit connected in parallel with the static type latch circuit to the output of the first dynamic type latch circuit. In a circuit provided with a third dynamic type latch circuit, a scan output is obtained from the third dynamic type latch circuit at the time of the scan mode.

Preferably, the static type latch circuit is provided with a clear signal input terminal and clears the held data by input of a clear signal. Even if the clear signal is input, a scan output is obtained from the third dynamic type latch circuit, so even if a clear signal is input, the scan operation is not affected.

Still more preferably, there is further provided a selection circuit for setting the previous scanned data to the dynamic node of the first dynamic type latch circuit in accordance with the input of a control signal. In a circuit with a selection circuit, a so-called boundary scan cell is constructed.

A circuit for performing a cross-check may be connected to the first dynamic type latch circuit. The circuit for performing the cross-check may alternatively be connected to the second dynamic type latch circuit. By connecting the circuit for performing the cross-check to the output sides of the first and second dynamic latch circuits, a delay test is realized.

The circuit for performing the cross-check may comprise a transistor provided between the dynamic holding node of the dynamic type latch circuit and a sense line and the gate thereof is connected to a probe line. The sense line value is written in accordance with the level of the probe line connected to the transfer gate of the point for performing the cross-check connected to the first dynamic type latch circuit.

BRIEF DESCRIPTION OF THE DRAWINGS

These and other features and objects of the present invention will become more apparent from the following description of the preferred embodiments with reference to the attached drawings, in which:

FIGS. 14A to 14F are timing charts for explaining the operation of the circuit of FIG. 13 at the time of a normal mode;

FIGS. 15A to 15G are timing charts for explaining the operation of the circuit of FIG. 13 at the time of a scan mode;

FIGS. 20A to 20E are timing charts for explaining the operation of the circuit of FIG. 19 at the time of a normal mode;

FIGS. 21A to 21E are timing charts for explaining the operation of the circuit of FIG. 19 at the time of a scan mode;

FIGS. 28A to 28E are timing charts for explaining the operation of the circuit of FIG. 27 at the time of a normal mode;

FIGS. 29A to 29E are timing charts for explaining the operation of the circuit of FIG. 27 at the time of a write mode;

FIGS. 31A to 31G are timing charts for explaining the operation of the circuit of FIG. 30 at the time of a normal mode;

FIGS. 32A to 32G are timing charts for explaining the operation of the circuit of FIG. 30 at the time of a delay test mode.

DESCRIPTION OF THE PREFERRED EMBODIMENTS

The preferred embodiments of the present invention will now be explained in further detail with reference to the drawings.

First Embodiment

Figure 3:
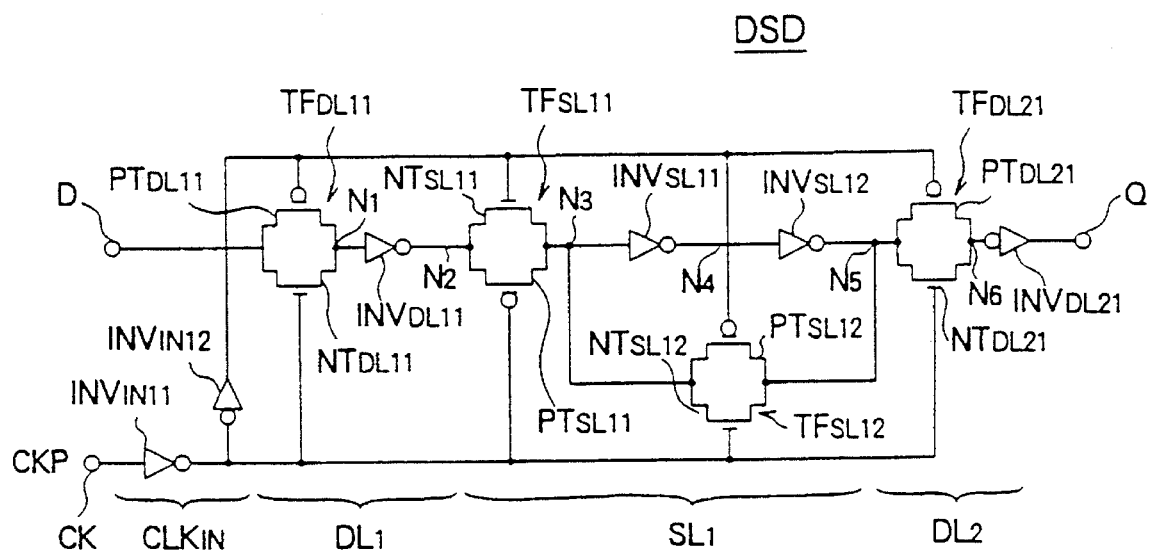
FIG. 3 is a circuit diagram of a first embodiment of a synchronizing circuit according to the present invention.
Figure 4:
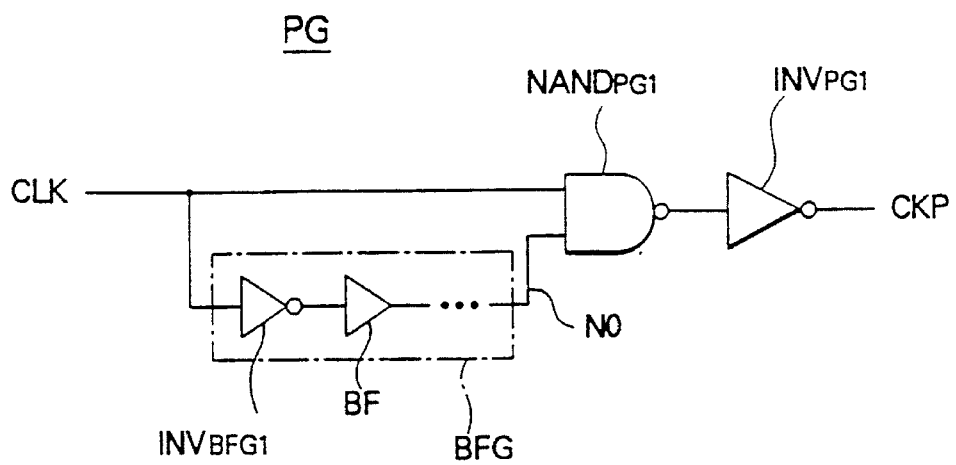
FIG. 4 is a circuit diagram of an example of the configuration of a pulse generation circuit according to the present invention.

FIG. 3 is a circuit diagram of a first embodiment of a synchronizing circuit according to the present invention, FIG. 4 is a circuit diagram of an example of the configuration of a pulse generation circuit according to the present invention, and FIGS. 5A to 5K are timing charts of the operation of different parts of FIG. 3 and FIG. 4.

In the figure, DSD shows a synchronizing circuit, DL1 a first dynamic type through latch circuit, SL1 a static type through latch circuit, DL2 a second dynamic type through latch circuit, $CLK_{IN}$ a clock input circuit, and PG a pulse generation circuit shown in FIG. 4.

The synchronizing circuit DSD is comprised of the first dynamic type through latch circuit DL1 and the second dynamic type through latch circuit DL2 between which is sandwiched the static type through latch circuit SL1, all of these circuits connected in cascade. The synchronizing circuit DSD performs sampling of data at the timing of the rising edge of a clock signal CKP generated by a pulse generation circuit PG shown in FIG. 4 which is input to the clock input circuit $CLK_{IN}$ and outputs the data at the timing of the trailing edge of the clock signal CKP.

The first dynamic type through latch circuit DL1 is comprised by the transfer gate $TF_{DL11}$ and the inverter $INV_{DL11}$.

The transfer gate $TF_{DL11}$ is comprised of a p-channel MOS transistor $PT_{DL11}$ and n-channel MOS transistor $NT_{DL11}$ with their sources and drains connected with each other to form two input/output terminals. One input/output terminal is connected to a data input terminal D, while the other input/output terminal is connected to the input of the inverter $INV_{DL11}$ as a node N1.

The static type through latch circuit SL1 is comprised by the transfer gates $TF_{SL11}$ and $TF_{SL12}$ and the series-connected inverters $INV_{SL11}$ and $INV_{SL12}$.

The transfer gate $TF_{SL11}$ is comprised of a p-channel MOS transistor $PT_{SL11}$ and n-channel MOS transistor $NT_{SL11}$ with their sources and drains connected with each other to form two input/output terminals. One input/output terminal is connected to the output of the inverter $INV_{DL11}$ of the first dynamic type through latch circuit DL1 comprising the node N2. The other input/output terminal is connected to the input of the inverter $INV_{SL11}$ and one input/output terminal of the transfer gate $TF_{SL12}$. A node N3 is formed from the connection points of the same.

The transfer gate $TF_{SL12}$ is comprised of a p-channel MOS transistor $PT_{SL12}$ and n-channel MOS transistor $NT_{SL12}$ with their sources and drains connected with each other to form two input/output terminals. One input/output terminal is connected to the node N3, while the other input/output terminal is connected to the output of the inverter $INV_{SL12}$. A node N5 is formed from the connection points of the same.

Further, the node N4 is formed from the output of the inverter $INV_{SL11}$ and the node N4 is connected to the input of the inverter $INV_{SL12}$.

The second dynamic type through latch circuit $DL_2$ is comprised by the transfer gate $TF_{DL21}$ and the inverter $INV_{DL21}$.

The transfer gate $TF_{DL21}$ is comprised of a p-channel MOS transistor $PT_{DL21}$ and n-channel MOS transistor $NT_{DL21}$ with their sources and drains connected with each other to form two input/output terminals. One input/output terminals is connected to the node N5, that is the output of the static type through latch circuit SL1, while the other input/output terminal is connected to the input of the inverter $INV_{DL21}$ as a node N6.

The output of the inverter $INV_{DL21}$ is connected to the data output terminal Q.

The clock input circuit $CLK_{IN}$ is comprised of the series-connected inverters $INV_{IN11}$ and $INV_{IN12}$.

The input of the inverter $INV_{IN11}$ is connected to the clock input terminal CK. The output of the inverter $INV_{IN12}$ is connected to the gate of the p-channel MOS transistor $PT_{DL11}$ of the transfer gate $TF_{DL11}$ of the first dynamic type through latch circuit DL1, the gate of the n-channel MOS transistor $NT_{SL11}$ of the transfer gate $TF_{SL11}$ of the static type through latch circuit SL1, the gate of the p-channel MOS transistor $PT_{SL12}$ of the transfer gate $TF_{SL12}$, and the gate of the p-channel MOS transistor $PT_{DL21}$ of the transfer gate $TF_{DL21}$ of the second dynamic type through latch circuit DL2.

Further, the node of the output of the inverter $INV_{IN11}$ and the input of the inverter $INV_{IN12}$ is connected to the gate of the n-channel MOS transistor $NT_{DL11}$ of the transfer gate $TF_{DL11}$ of the first dynamic type through latch circuit DL1, the gate of the p-channel MOS transistor $PT_{SL11}$ of the transfer gate $TF_{SL11}$ of the static type through latch circuit SL1, the gate of the n-channel MOS transistor $NT_{SL12}$ of the transfer gate $TF_{SL12}$, and the gate of the n-channel MOS transistor $NT_{DL21}$ of the transfer gate $TF_{DL21}$ of the second dynamic type through latch circuit DL2.

The pulse generation circuit PG, as shown in FIG. 4, is comprised of the two-input NAND circuit $NAND_{PG1}$, the inverter $INV_{PG1}$, and the pulse width adjustment buffer group BFG and, for example, generates the clock pulse signal CKP restricted to a pulse width of 5 nsec. That is, it outputs the pulse signal CKP of the time width required for compensation for clock skew in synchronization with the rising edge of the input clock signal CLK.

One input of the NAND circuit $NAND_{PG1}$ is connected to the input line of the clock signal CLK of the predetermined period, while the other input is connected to the output line of the output signal NO of a pulse width adjustment buffer group BFG.

The pulse width adjustment buffer group BFG is comprised of the inverter $INV_{BFG1}$ to which the clock signal CLK is input and the plurality of buffers BF connected in series to the output side of the inverter $INV_{BGF1}$ and outputs to the NAND circuit $NAND_{PG1}$ the signal NO for adjusting the pulse width of the clock signal CLK.

The output of the NAND circuit $NAND_{PG1}$ is connected to the input of the inverter $INV_{PG1}$. The NAND circuit $NAND_{PG1}$ takes the NAND of the clock signal CLK and the signal NO and outputs the result to the inverter $INV_{PG1}$.

Figure 5:
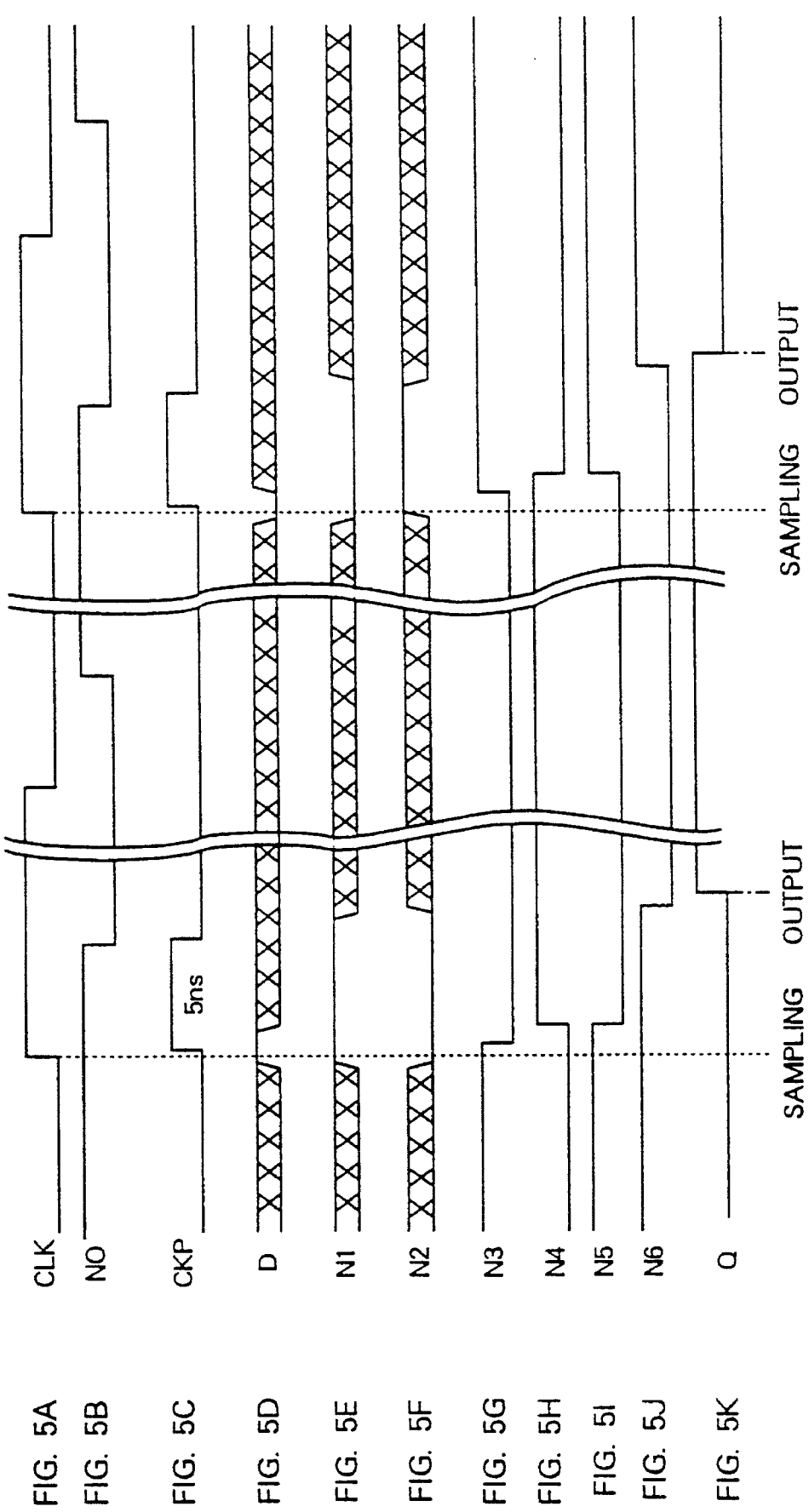
FIGS. 5A to 5K are timing charts of the operation of different parts of FIG. 3 and FIG. 4.

The output of the inverter $INV_{PG1}$ is connected to the clock input terminal CK of the synchronizing circuit DSD and outputs the clock pulse signal CKP restricted in pulse width to, for example, 5 nsec, as shown in FIG. 5C.

Next, an explanation will be made of the operation of the above configuration with reference to the timing charts of FIGS. 5A to 5K.

First, in the pulse generation circuit PG, the NAND of the clock signal CLK and the output signal NO of the pulse width adjustment buffer group BFG is taken by the NAND circuit $NAND_{PG1}$ and the result is input to the inverter $INV_{PG1}$. This is output as the clock pulse signal CKP adjusted to the time width, for example, 5 nsec, necessary for the pulse width to compensate for the clock skew.

The clock pulse signal CKP output from the pulse generation circuit PG is input to the clock input terminal CK of the synchronizing circuit DSD and is input to the clock input unit CLK$_{IN}$.

At the clock input circuit CLK$_{IN}$, at the timing of the rising edge of the clock pulse signal CKP, the output side of the inverter INV$_{IN11}$ becomes low in level and output side of the inverter INV$_{IN12}$ becomes high in level.

Accordingly, the n-channel MOS transistor NT$_{DL11}$ of the transfer gate TF$_{DL11}$ of the first dynamic type through latch circuit DL1 connected to the output of the inverter INV$_{IN11}$, the n-channel MOS transistor NT$_{SL12}$ of the transfer gate TF$_{SL12}$ of the static type through latch circuit SL1, and the n-channel MOS transistor NT$_{DL21}$ of the transfer gate TF$_{DL21}$ of the second dynamic type through latch circuit DL2 become off in state, while the p-channel MOS transistor PT$_{SL11}$ Of the transfer gate TF$_{SL11}$ of the static type through latch circuit SL1 becomes on in state.

Similarly, the p-channel MOS transistor PT$_{DL11}$ Of the transfer gate TF$_{DL11}$ of the first dynamic type through latch circuit DL1 connected to the output of the inverter INV$_{IN12}$, the p-channel MOS transistor PT$_{SL12}$ of the transfer gate TF$_{SL12}$, of the static type through latch circuit SL1, and the p-channel MOS transistor PT$_{DL21}$ of the transfer gate TF$_{DL21}$ of the second dynamic type through latch circuit DL2 become off in state, while the n-channel MOS transistor NT$_{SL11}$ of the transfer gate TF$_{SL11}$ of the static type through latch circuit SL1 becomes on in state.

That is, the transfer gates TF$_{DL11}$, TF$_{SL12}$, and TF$_{DL21}$ become nonconductive in state, while the transfer gate TF$_{SL11}$ becomes conductive in state.

As a result, in the example of FIG. 5E, the node N1 at the first dynamic type through latch circuit DL1 is held at the high level and the node N2 is held at the low level.

At this time, since the transfer gate TF$_{SL11}$ of the second static type through latch circuit SL1 is in the conductive state, the node N3 is held at the low level, the node N4 at the high level, and the node N5 at the low level.

Further, since the transfer gate TF$_{DL21}$ of the second dynamic type through latch circuit DL2 is in the nonconductive state, the node N6 is held at the high level.

Accordingly, the level of the output terminal Q becomes low.

Further, after 5 nsec at the timing when the clock pulse signal CKP falls, the output side of the inverter INV$_{IN11}$ of the clock input circuit CLK$_{IN}$ becomes high in level and the output side of the inverter INV$_{IN12}$ becomes low in level.

As a result, the transfer gates TF$_{DL11}$, TF$_{SL12}$, and TF$_{DL21}$ are switched to the conductive state, while the transfer gate TF$_{SL11}$ is switched to the nonconductive state.

Along with this, the low level of the node N5 is conveyed to the node N6 through the transfer gate TF$_{DL21}$ and the output terminal Q is switched to the high level through the inverter INV$_{DL21}$.

In this way, the synchronizing circuit DSD performs sampling of data at the rising edge of the clock pulse signal CKP and outputs the data at the trailing edge.

As a result, the circuit can operate normally even if there is a clock skew of the amount of the pulse width of the clock pulse signal CKP produced by the pulse generation circuit PG.

As explained above, according to this embodiment, provision is made of a first dynamic type through latch circuit DL1 and second dynamic type through latch circuit DL2 between which is arranged a static type through latch circuit SL1, the circuits connected in cascade, wherein data is sampled at the timing of the rising edge of the clock signal CKP generated by a pulse generation circuit PG connected to a clock input circuit CLK$_{IN}$ and data is output at the timing of the trailing edge. By making the clock pulse width generated at the pulse generation circuit larger than the clock skew, it is possible to prevent malfunctions of the LSI caused by clock skew caused by deviation of timing of the clock allocation.

Further, the layout of the clock allocation becomes easy.

Further, since two of the three latches constituting the circuit are made dynamic types, the circuit can be realized by about the same number of gates as a conventional static type D-type flipflop.

Further, despite the use of some dynamic latches, due to the joint use of a pulse generation circuit, there is no restriction on the minimum frequency of the original clock.

Further, when no pulse generation circuit is used, the maximum operating speed of the LSI becomes ½, so the reduction of the speed in the case of use of a pulse generation circuit is held to the rate of the output pulse width/clock cycle time. For example, when the clock skew is 5 nsec and the clock frequency is 20 MHz, there is only a 10 percent or so reduction in the maximum operating frequency.

Further, it is easy to change from a design centered on the conventional D-type flipflop, mixture is possible, and timing inspection is easy.

Note that in this embodiment, the data is sampled at the rising edge of the clock pulse signal CKP and the data is output at the trailing edge, but it is of course also possible to construct things so that the data is sampled at the trailing edge of the clock signal CKP and the data is output at the rising edge. A similar effect as mentioned above can be obtained.

In this embodiment, a single storage cell was made by sandwiching one static type latch circuit between two dynamic type latch circuits, but it is also possible to make the storage cell by a single dynamic type latch circuit and a single static type latch circuit at portions where no countermeasures against clock skewing are needed in the LSI. In this case, there is the advantage of the reduction of the number of gates.

Further, in this embodiment, use was made of a circuit configuration including a static type latch circuit, but if the synchronization of the original clock signal can be always done within the data holding time of the dynamic type latch, then it is also possible to make the circuit comprised of all dynamic type latch circuits. In this case too, it is possible to reduce the number of gates.

Figure 6:
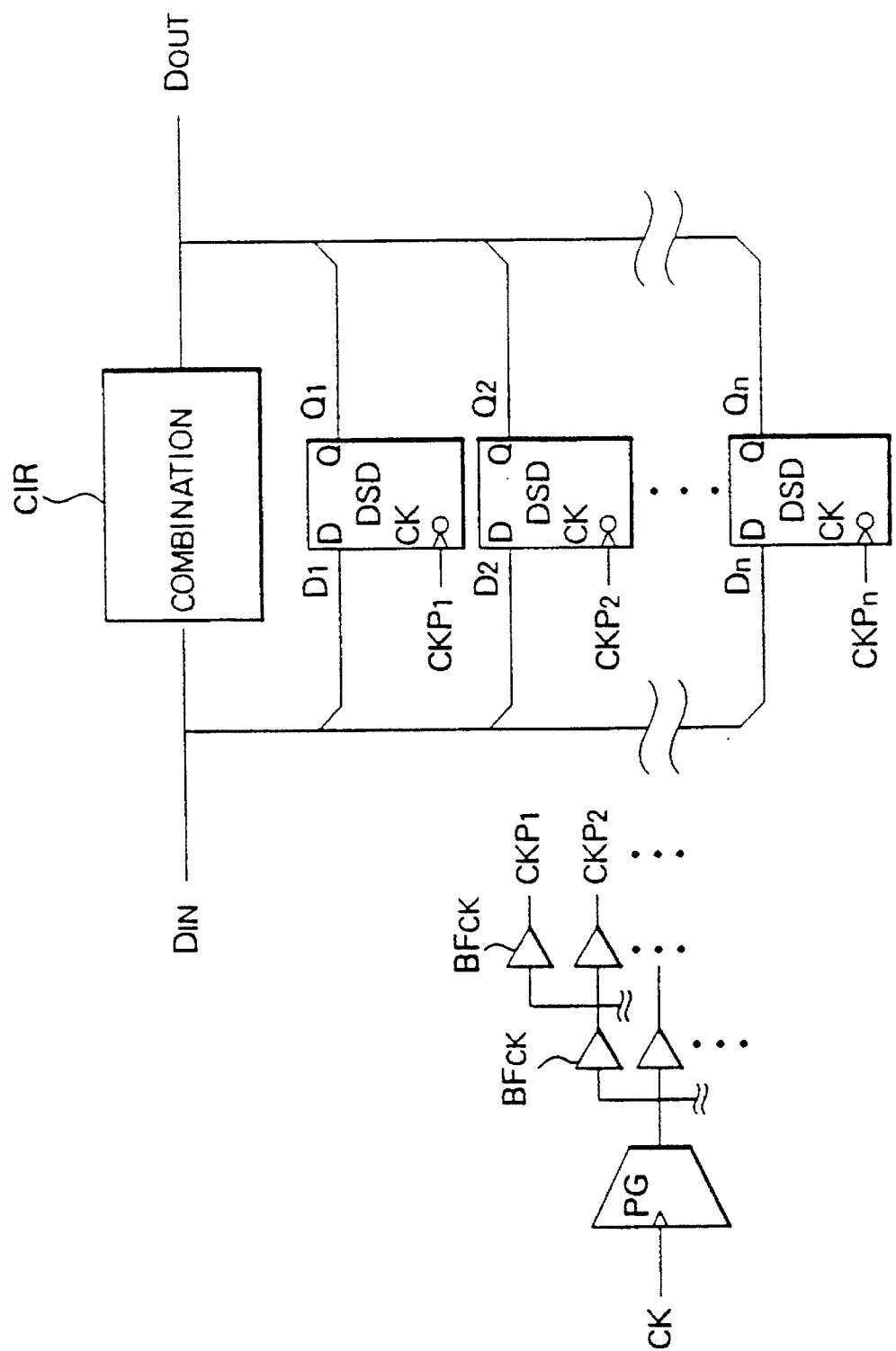
FIG. 6 is a block diagram of an example of the configuration of a combination of a plurality of synchronizing circuits and a pulse generation circuit.

FIG. 6 is a block diagram of an example of the configuration of a combination of a plurality of synchronizing circuits and a pulse generation circuit. In this example, the synchronizing circuits DSD and the pulse generation circuit PG are shown in the figure by their symbols.

The clock pulse signals CKPn (where, n=1, 2, . . . , n) for input to the clock input terminals CK of the synchronizing circuits DSD, for example, as shown in FIG. 6, are generated by insertion of clock buffers BF$_{CK}$ in the output side of the pulse generation circuit PG in accordance with need.

Further, in FIG. 6, CIR shows a combination circuit not having a data storage function, D$_{IN}$ shows the input data, and D$_{OUT}$ shows the output data.

In this case, the pulse width of the clock pulse signals CKPn generated by the pulse generation circuit PG is the pulse width for determining the data holding time of the dynamic type latch circuit. It is larger than the time difference of the clock pulse signal reaching the plurality of parallel storage cells and fits in the time width for which holding of data by the dynamic type latch circuit is guaranteed.

The holding time in the case of the synchronizing circuit DSD of FIG. 3 will be considered with reference to FIG. 6.

Note, the explanation will be made taking as an example the case of inputting the output $Q_1$ of the first stage synchronizing circuit DSD through the combination circuit CIR to the input terminal $D_2$ of the second stage synchronizing circuit DSD. It is supposed that the delay time $d_1$ from the clock signal $CKP_1$ of the pulse generation circuit PG to the clock input terminal CK of the first stage synchronizing circuit DSD is made 2 nsec, the delay time $d_2$ from the clock signal $CKP_2$ of the pulse generation circuit PG to the clock input terminal CK of the second stage synchronizing circuit DSD is made 4 nsec, and the output pulse width PW of the pulse generation circuit PG is made 5 nsec. Assume that the delay time $d_3$ from the trailing edge of the clock signal $CKP_1$ applied to the clock input terminal CK of the first synchronizing circuit DSD to when the signal of the output terminal Q changes and this signal reaches the input terminal $D_2$ of the second stage DSD through the combination circuit CIR is made 2 nsec, and the holding time HT of the second stage synchronizing circuit DSD is made 0.5 nsec.

At this time, the margin of the holding time HTS becomes as follows:

$$HTS = d_1 - d_2 + d_3 - HT + PW = 4.5 \text{ nsec}$$

This means the synchronization circuit of the present invention will prevent the malfunction discussed above.

Accordingly, in the case of application of the D-flipflop as in FIGS. 1 and 2, the margin of the holding time HTSC is reduced by about PW and becomes as follows:

$$HTSC = HTS - PW = -0.5 \text{ nsec}$$

Figure 1:
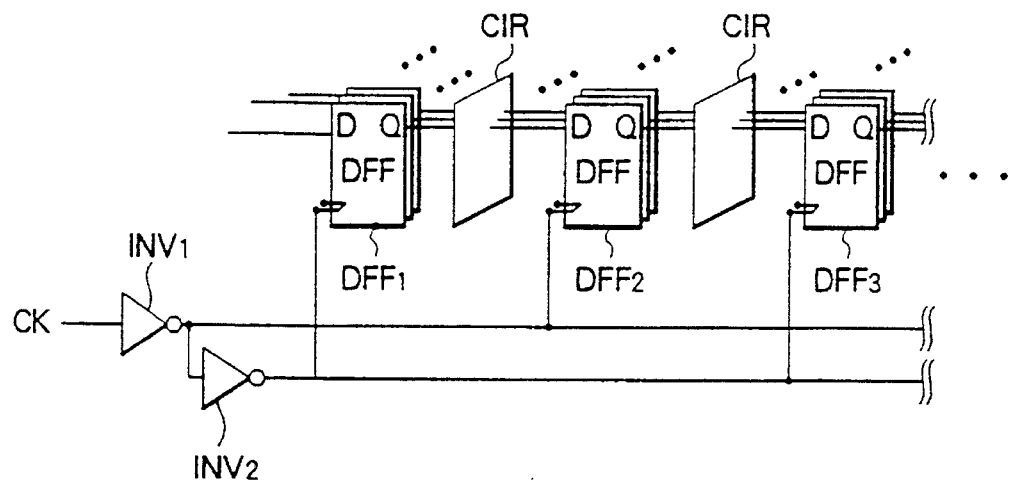
FIG. 1 is a view of an example of the configuration of a synchronizing circuit of a related art.
Figure 2:
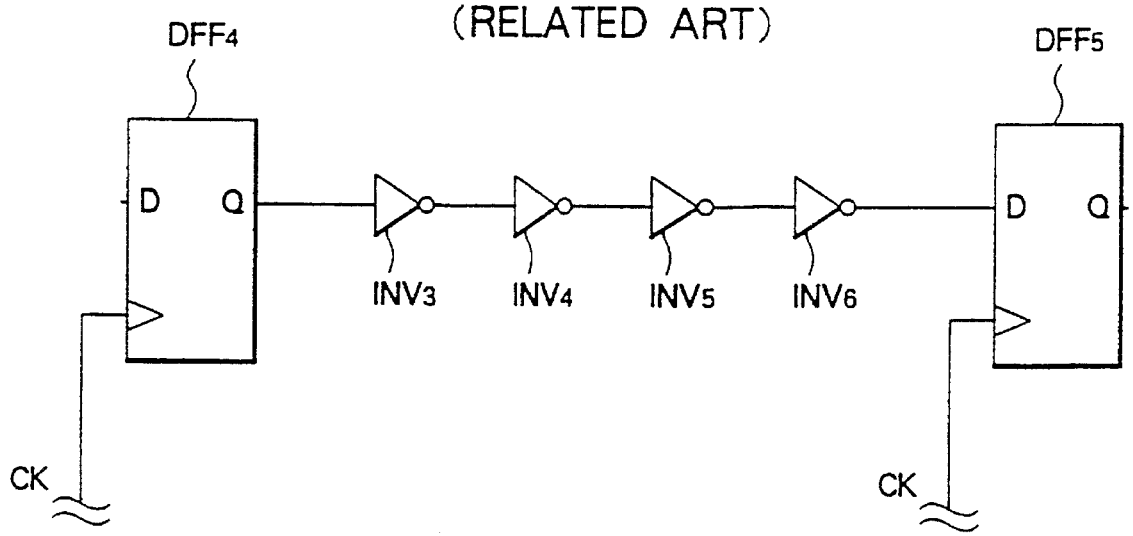
FIG. 2 is a view of another example of the configuration of a synchronizing circuit of another related art.

Accordingly, in the case of the circuits in FIGS. 1 and 2, error occurred.

Figure 7:
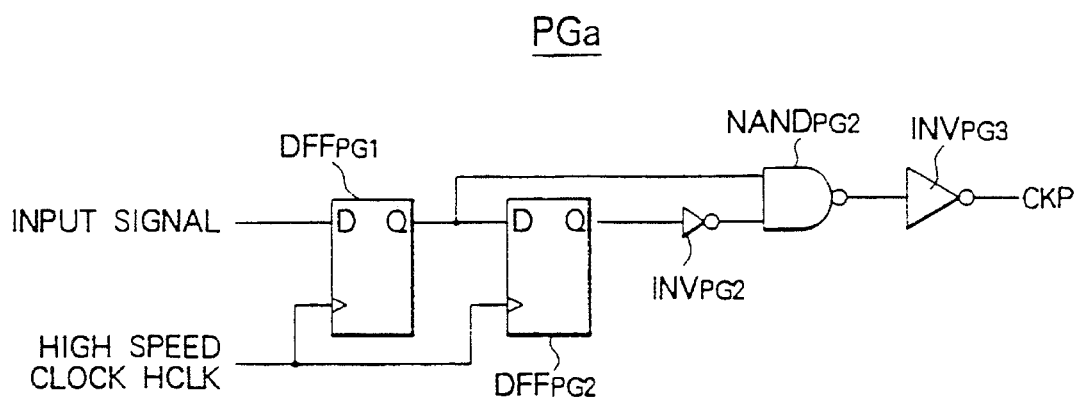
FIG. 7 is a circuit diagram of another example of the configuration of a pulse generation circuit according to the present invention.

FIG. 7 is a circuit diagram of another example (modification) of the configuration of a pulse generation circuit according to the present invention. This pulse generation circuit PGa shows an example of the case of use of a high speed clock.

The pulse generation circuit PGa is comprised of the D-flipflops $DFF_{PG1}$ and $DFF_{PG2}$ connected in cascade with the clock input terminals of the same receiving as input the high speed clock HCLK of for example 100 MHz. The Q-output of the first stage flipflop $DFF_{PG1}$ to which the input data is input and the Q-output of the second stage flipflop $DFF_{PG2}$ through the inverter $INV_{PG2}$ are input to the NAND circuit $NAND_{PG2}$ where the NAND is taken. The result is output through the inverter INVPG3. The output clock pulse signal CKP of the pulse generation circuit PGa is input to the clock input terminal of the synchronizing circuit DSD shown in FIG. 3.

Second Embodiment

Figure 8:
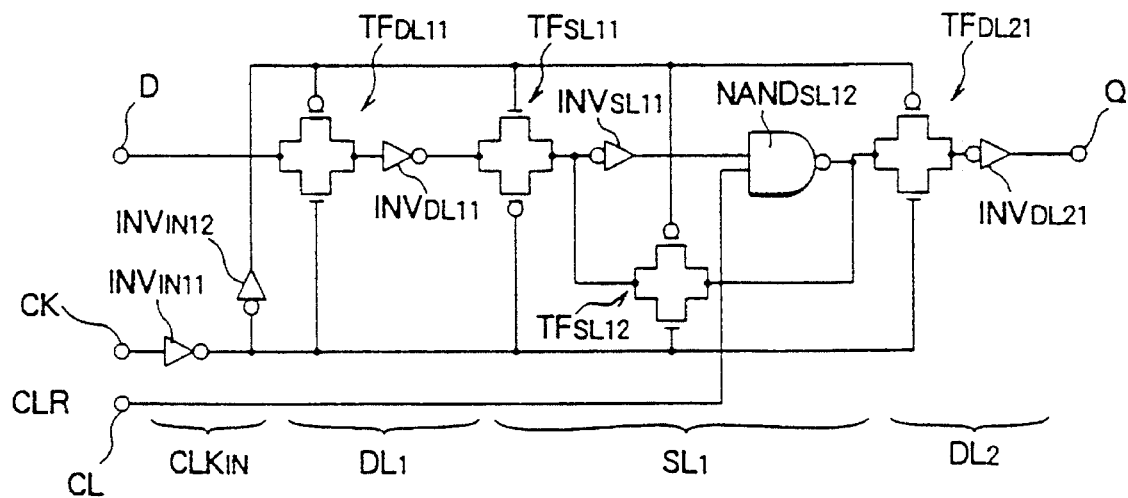
FIG. 8 is a circuit diagram of a second embodiment of a synchronizing circuit according to the present invention.

FIG. 8 is a circuit diagram of a second embodiment of a synchronizing circuit according to the present invention.

The point of difference between this embodiment and the first embodiment lies in the addition of a clear function.

Specifically, instead of the inverter $INV_{SL12}$ in the static type through latch circuit SL1 of FIG. 3, provision is made of a two-input NAND circuit $NAND_{SL12}$. One input of the two-input NAND circuit $NAND_{SL12}$ is connected to the output of the inverter $INV_{SL11}$ and the other input is connected to a clear input terminal CL of a clear signal CLR.

Upon receipt of the clear signal CLR, the synchronizing circuit of FIG. 8 is cleared, that is, is reset.

The rest of the configuration is the same as in the first embodiment explained above. A similar effect as the first embodiment can be obtained.

Third Embodiment

Figure 9:
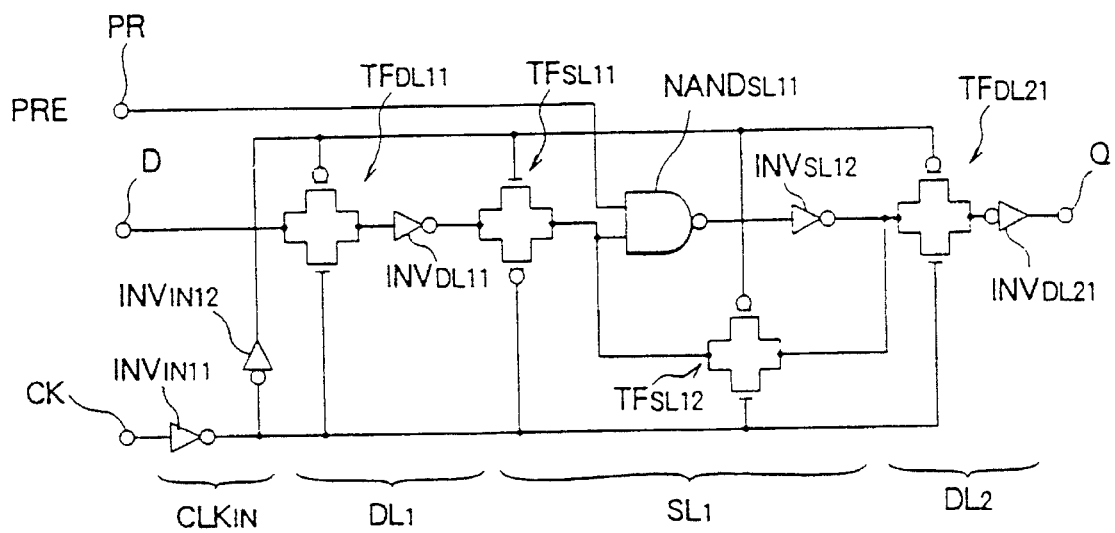
FIG. 9 is a circuit diagram of a third embodiment of a synchronizing circuit according to the present invention.

FIG. 9 is a circuit diagram of a third embodiment of a synchronizing circuit according to the present invention.

The point of difference between this embodiment and the first embodiment lies in the addition of a preset function.

Specifically, instead of the inverter $INV_{SL11}$ in the static type through latch circuit SL1 of FIG. 3, provision is made of a two-input NAND circuit $NAND_{SL11}$. One input of the two-input NAND circuit $NAND_{SL11}$ is connected to the output of the transfer gate $TF_{SL11}$ and the other input is connected to a reset signal input terminal PR of a preset signal PRE.

Upon receipt of the preset signal PRE, the synchronizing circuit of FIG. 9 is preset.

The rest of the configuration is the same as in the first embodiment explained above. A similar effect as the first embodiment can be obtained.

Fourth Embodiment

Figure 10:
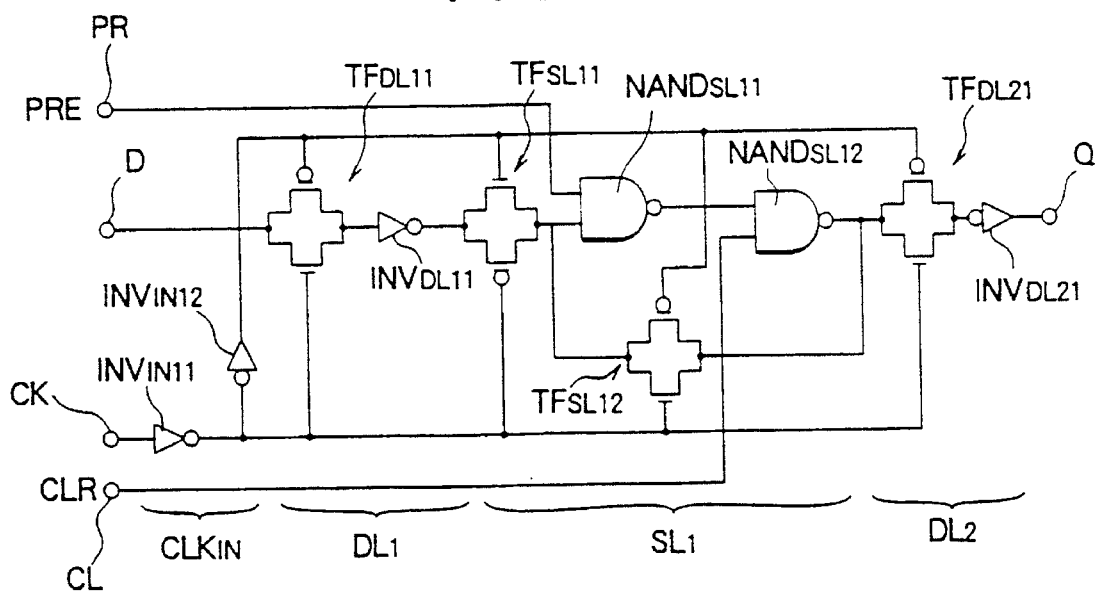
FIG. 10 is a circuit diagram of a fourth embodiment of a synchronizing circuit according to the present invention.

FIG. 10 is a circuit diagram of a fourth embodiment of a synchronizing circuit according to the present invention.

The point of difference between this embodiment and the first embodiment lies in the addition of clear and preset functions. Thus, the synchronizing circuit of FIG. 10 has a circuit configuration of a combination of the synchronizing circuits of FIGS. 8 and 9.

Specifically, instead of the inverter $INV_{SL11}$ in the static type through latch circuit SL1 of FIG. 3, provision is made of a two-input NAND circuit $NAND_{SL11}$. One input of the two-input NAND circuit $NAND_{SL11}$ is connected to the output of the transfer gate $TF_{SL11}$ and the other input is connected to the input terminal PR of the preset signal. Also, instead of the inverter $INV_{SL12}$, provision is made of a two-input NAND circuit $NAND_{SL12}$. One input of the two-input NAND circuit $NAND_{SL12}$ is connected to the output of the two input NAND circuit $NAND_{SL11}$ and the other input is connected to the input terminal CL of the clear signal.

The rest of the configuration is the same as in the first embodiment explained above. A similar effect as the first embodiment can be obtained.

Fifth Embodiment

Figure 11:
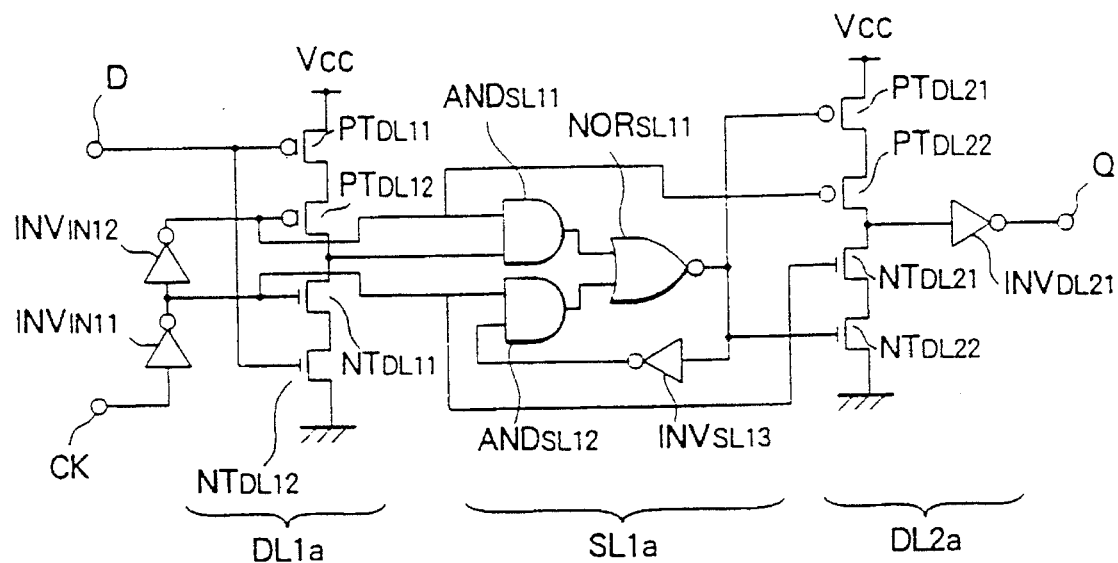
FIG. 11 is a circuit diagram of a fifth embodiment of a synchronizing circuit according to the present invention.

FIG. 11 is a circuit diagram of a fifth embodiment of a synchronizing circuit according to the present invention.

In this embodiment, the first and second dynamic type through latch circuits and the static type through latch circuit are configured differently from the first embodiment.

Specifically, a first dynamic type through latch circuit DL1a is comprised as a so-called clocked inverter which connects the p-channel MOS transistors $PT_{DL11}$ and $PT_{DL12}$ and the n-channel MOS transistors $NT_{DL11}$ and $NT_{DL12}$ in series between the supply line of the power source voltage $V_{cc}$ and the ground.

The gate of the p-channel MOS transistor $PT_{DL11}$ and the gate of the n-channel MOS transistor $NT_{DL12}$, are connected to the data input terminal D, the gate of the p-channel MOS transistor $PT_{DL12}$ is connected to the output of the inverter $INV_{IN12}$, and the gate of the n-channel MOS transistor $NT_{DL11}$ is connected to the output of the inverter $INV_{IN11}$.

The static type through latch circuit SL1a is comprised of the two-input AND circuit $AND_{SL11}$ and $AND_{SL12}$, the NOR circuit $NOR_{SL11}$, and the inverter $INV_{SL13}$.

One input of the AND circuit $AND_{SL11}$ is connected to the node of the p-channel MOS transistor $PT_{DL12}$ of the first dynamic type through latch circuit DL1a and n-channel MOS transistor $NT_{DL11}$, while the other input is connected to the node between the gate of the p-channel MOS transistor $PT_{DL12}$ and output of the inverter $INV_{IN12}$. The output is connected to one input of the NOR circuit $NOR_{SL11}$.

One input of the AND circuit $AND_{SL11}$ is connected to the node between the gate of the n-channel MOS transistor $NT_{DL11}$ of the first dynamic type through latch circuit DL1a and the output of the inverter $INV_{IN11}$, while the other input is connected to the output of the inverter $INV_{SL13}$ The output is connected to the other input of the NOR circuit $NOR_{SL11}$.

The output of the NOR circuit $NOR_{SL11}$ is connected to the input of the inverter $INV_{SL13}$.

The second dynamic type through latch circuit DL2a is comprised of a clocked inverter consisting of the p-channel MOS transistors $PT_{DL21}$ and $PT_{DL22}$, and n-channel MOS transistors $NT_{DL21}$ and $NT_{DL22}$ connected in series between the supply line of the power source voltage $V_{cc}$ and the ground and an inverter $INV_{DL22}$.

The gate of the p-channel MOS transistor $PT_{DL21}$ and the gate of the n-channel MOS transistor $NT_{DL22}$, are connected to the output of the NOR circuit $NOR_{SL11}$ of the static type through latch circuit SL1a, the gate of the p-channel MOS transistor $PT_{DL22}$ is connected to the node of the output of the inverter $INV_{IN12}$ and the gate of the p-channel MOS transistor $PT_{DL12}$, and the gate of the n-channel MOS transistor $NT_{DL21}$ is connected to the node of the output of the inverter $INV_{IN11}$ and the gate of the n-channel MOS transistor $NT_{DL11}$.

The node of the p-channel MOS transistor $PT_{DL22}$ and the n-channel MOS transistor $NT_{DL21}$ is connected to the input of the inverter $INV_{DL21}$ and the output of the inverter $INV_{DL21}$ is connected to the data output terminal Q.

In such a configuration too, a similar action and effect can be obtained as in the first embodiment mentioned above.

Sixth Embodiment

Figure 12:
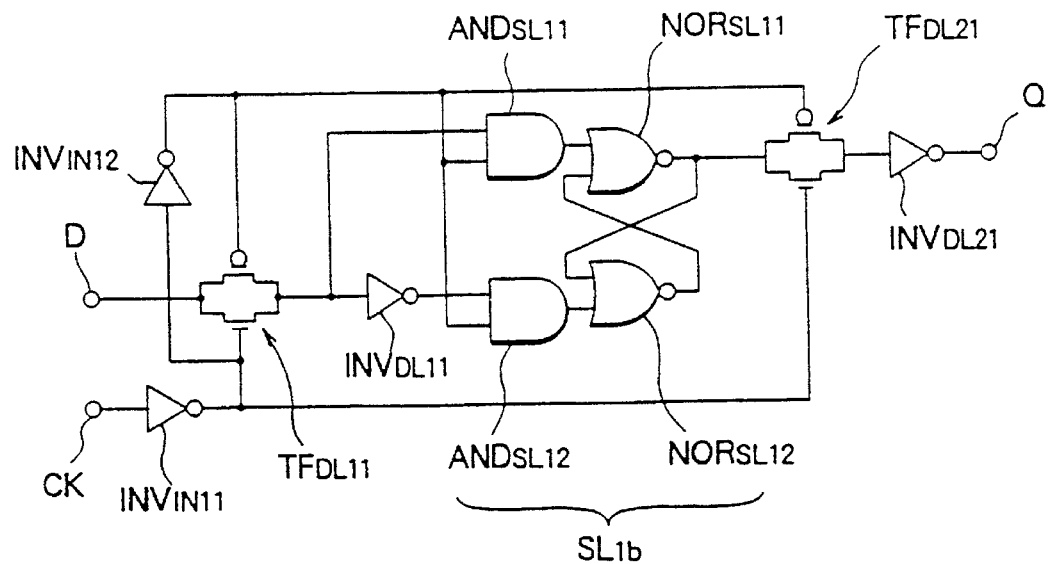
FIG. 12 is a circuit diagram of a sixth embodiment of a synchronizing circuit according to the present invention.

FIG. 12 is a circuit diagram of a sixth embodiment of a synchronizing circuit according to the present invention.

In this embodiment, the static type through latch circuit has a different configuration from that of the first embodiment.

Specifically, the static type through latch circuit SL1b is comprised by the two-input AND circuits $AND_{SL11}$ and $AND_{SL12}$ a and the two-input NOR circuits $NOR_{SL11}$ and $NOR_{SL12}$.

One of the inputs of the AND circuit $AND_{SL11}$ is connected to the other input/output terminal of the transfer gate $TF_{DL11}$, while the other input is connected to the output of the inverter $INV_{IN12}$. The output is connected to one of the inputs of the NOR circuit $NOR_{SL11}$.

One of the inputs of the AND circuit $AND_{SL12}$ is connected to the output of the inverter $INV_{DL11}$, while the other input is connected to the output of the inverter $INV_{IN12}$. The output is connected to one of the inputs of the NOR circuit $NOR_{SL12}$.

The other input of the NOR circuit $NOR_{SL11}$ is connected to the output of the NOR circuit $NOR_{SL12}$, while the other input of the NOR circuit $NOR_{SL12}$ is connected to the output of the NOR circuit $NOR_{SL11}$. The node between the other input of the NOR circuit $NOR_{SL12}$ and the output of the NOR circuit $NOR_{SL11}$ is connected to one of the input/output terminals of the transfer gate $TF_{DL21}$.

In such a configuration too, a similar action and effect can be obtained as in the first embodiment mentioned above.

Seventh Embodiment

Figure 13:
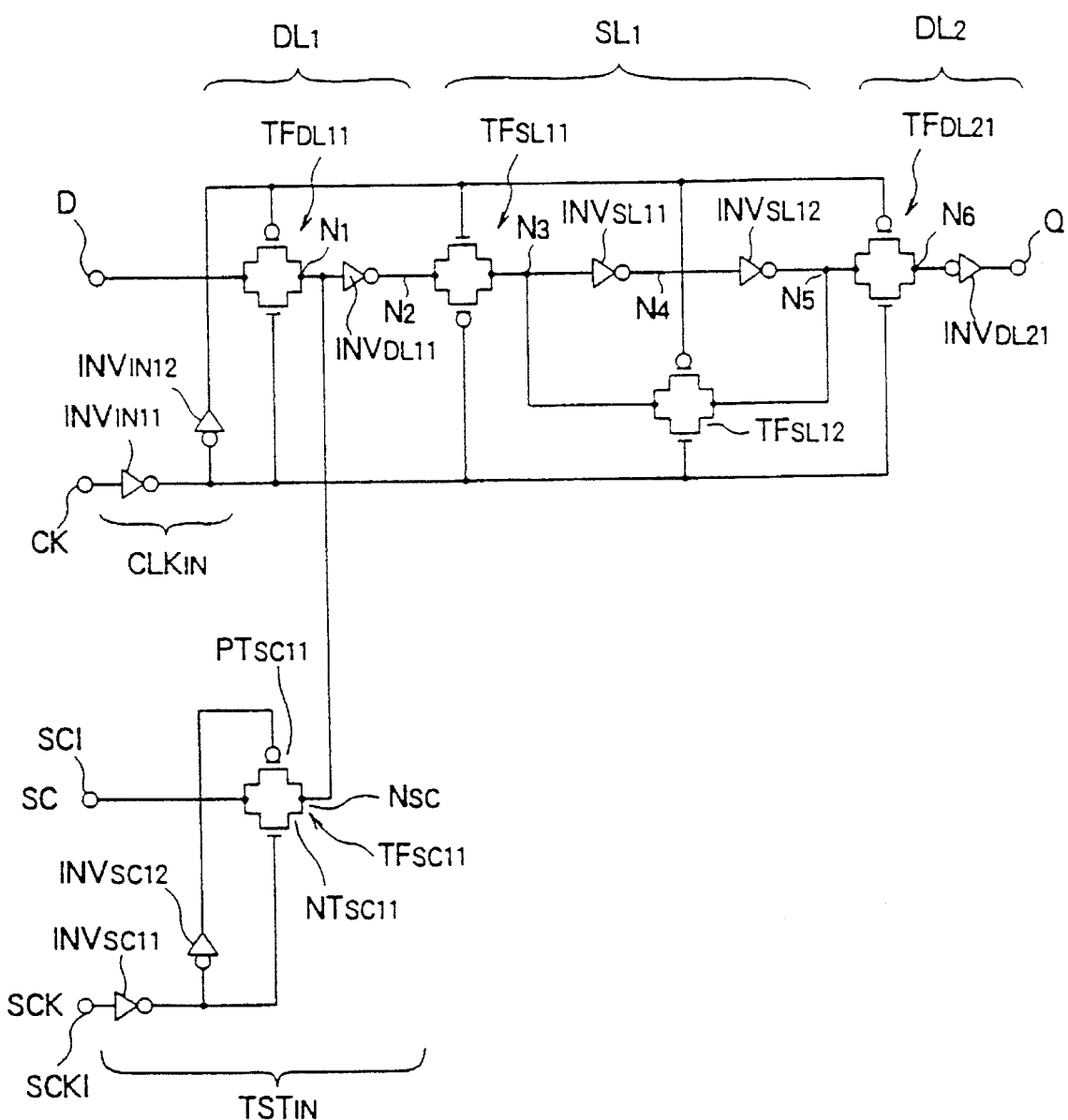
FIG. 13 is a circuit diagram of a seventh embodiment of a synchronizing circuit according to the present invention.

FIG. 13 is a circuit diagram of a seventh embodiment of a synchronizing circuit according to the present invention.

The point of difference of this embodiment from the first embodiment is that a scan function is added by providing the scan test signal input circuit $TST_{IN}$ in parallel with the first dynamic type through latch circuit DL1.

This scan test signal input circuit $TST_{IN}$ is comprised by the transfer gate $TF_{SC11}$ and the inverters $INV_{SC11}$ and $INV_{SC12}$.

For the specific connections, provision is made of a transfer gate $TF_{SC11}$ for input of the scan data SC in parallel with the transfer gate $TF_{DL11}$ of the first dynamic type through latch circuit DL1. One input/output terminal of the transfer gate $TF_{SC11}$ is connected to the other input/output terminal N1 of the transfer gate $TF_{DL11}$.

The transfer gate $TF_{SC11}$ p-channel MOS transistor $PT_{SC11}$ and the n-channel MOS transistor $NT_{SC11}$ with the sources and drains connected with each other. As mentioned above, one input/output terminal is connected to the other input/output terminal N1 of the transfer gate $TF_{DL11}$, while the other input/output terminal is connected to the input terminal SCI of the scan data SC.

Further, series-connected inverters $INV_{SC11}$ and $INV_{SC12}$ are provided for inputting at mutually complementary levels the control scan clock signal SCK to the control scan clock signal SCK to the gates of the p-channel MOS transistor $PT_{SC11}$ and the n-channel MOS transistor $NT_{SC11}$ of the transfer gate $TF_{SC11}$.

More specifically, the input of the inverter $INV_{SC11}$ is connected to the input terminal SCKI of the scan clock signal SCK, the node of the output of the inverter $INV_{SC11}$ and the input of the inverter $INV_{SC12}$ is connected to the gate of the n-channel MOS transistor $NT_{SC11}$ of the transfer gate $TF_{SC11}$ and the output of the inverter $INV_{SC12}$ is connected to the gate of the p-channel MOS transistor $PT_{SC11}$.

The operational modes of this synchronizing circuit $DSD_{SC}$ with this scan function are the normal mode and scan mode.

FIGS. 14A to 14F are timing charts of the normal mode, and FIGS. 15A to 15G are timing charts of the scan mode.

In the normal mode, as shown in FIG. 14C, the control scan clock signal SCK is fixed to the high level, while the transfer gate $TF_{SC11}$ is held in the nonconductive state. Accordingly, in the synchronizing circuit $DSD_{SC}$ with the scan function, a similar operation is performed as with the synchronizing circuit DSD shown in FIG. 3.

As opposed to this, in the scan mode, when the clock pulse signal CKP is set to the high level, then the control scan clock signal SCK is switched from the high level to the low level. In this state, the scan data SC is taken out from the input terminal SCI.

However, the scan data SC is not output to the Q-output. Therefore, no clock skew is caused even during the scan operation.

Next, when the control scan clock signal SCK is switched from the low level to the high level, then the clock pulse signal CKP is switched from the high level to the low level and the scan data is conveyed to the Q-output.

This completes one scan (shift) operation.

As explained above, according to this embodiment, a similar action and effect as the first embodiment explained above can be obtained, of course, a scan function can be realized with few additional circuits, there is almost no reduction of the operational speed, and it is possible to prevent the occurrence of clock skews even in the scan operation.

Eighth Embodiment

Figure 16:
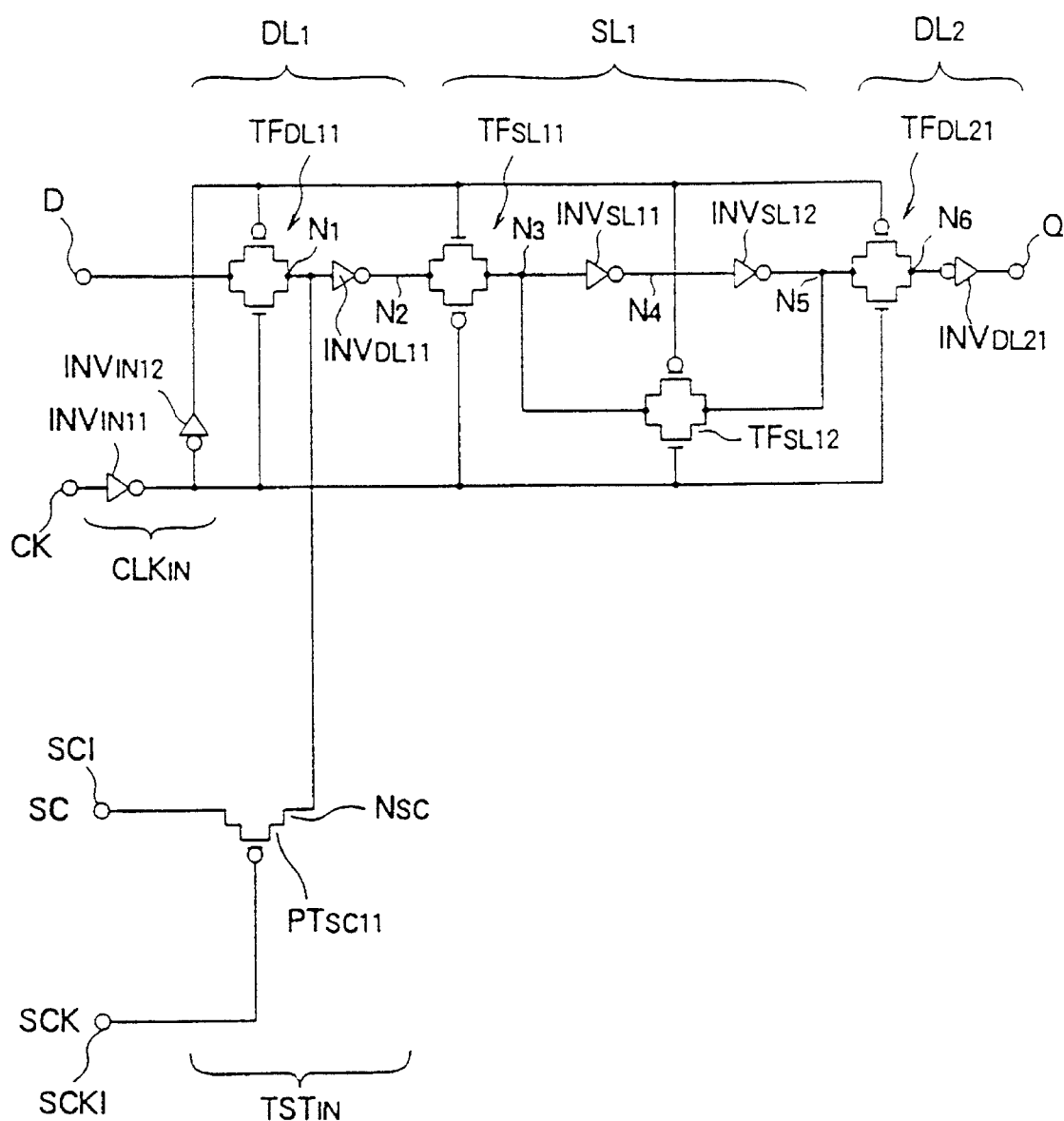
FIG. 16 is a circuit diagram of an eighth embodiment of a synchronizing circuit according to the present invention.

FIG. 16 is a circuit diagram of an eighth embodiment of a synchronizing circuit according to the present invention.

The point of difference of this embodiment from the seventh embodiment is that the transfer gate $TF_{SC11}$ for the scan operation is comprised only of the p-channel MOS transistor $PT_{SC11}$. Therefore, the inverters $INV_{SC11}$ and $INV_{SC12}$ for input of the control scan clock signal SCK are not provided either.

In the case of this configuration, a leakage current will occur during the scan operation, but this is acceptable since the scan operation is in actuality only performed at the time of inspection of the finished product. Further, the buffer for the scan clock signal SCK is eliminated, so a less sharp scan clock signal SCK arrives, but the synchronizing circuit itself, as mentioned above, is constructed so as not to cause clock skew, so there are no malfunctions caused due to the same.

Note that the transfer gate $TF_{SC11}$ for the scan can give a similar action and effect as one comprised only of the n-channel MOS transistor $NT_{SC11}$ and with a control use scan clock signal SCK inverted in level from the seventh embodiment.

Ninth Embodiment

Figure 17:
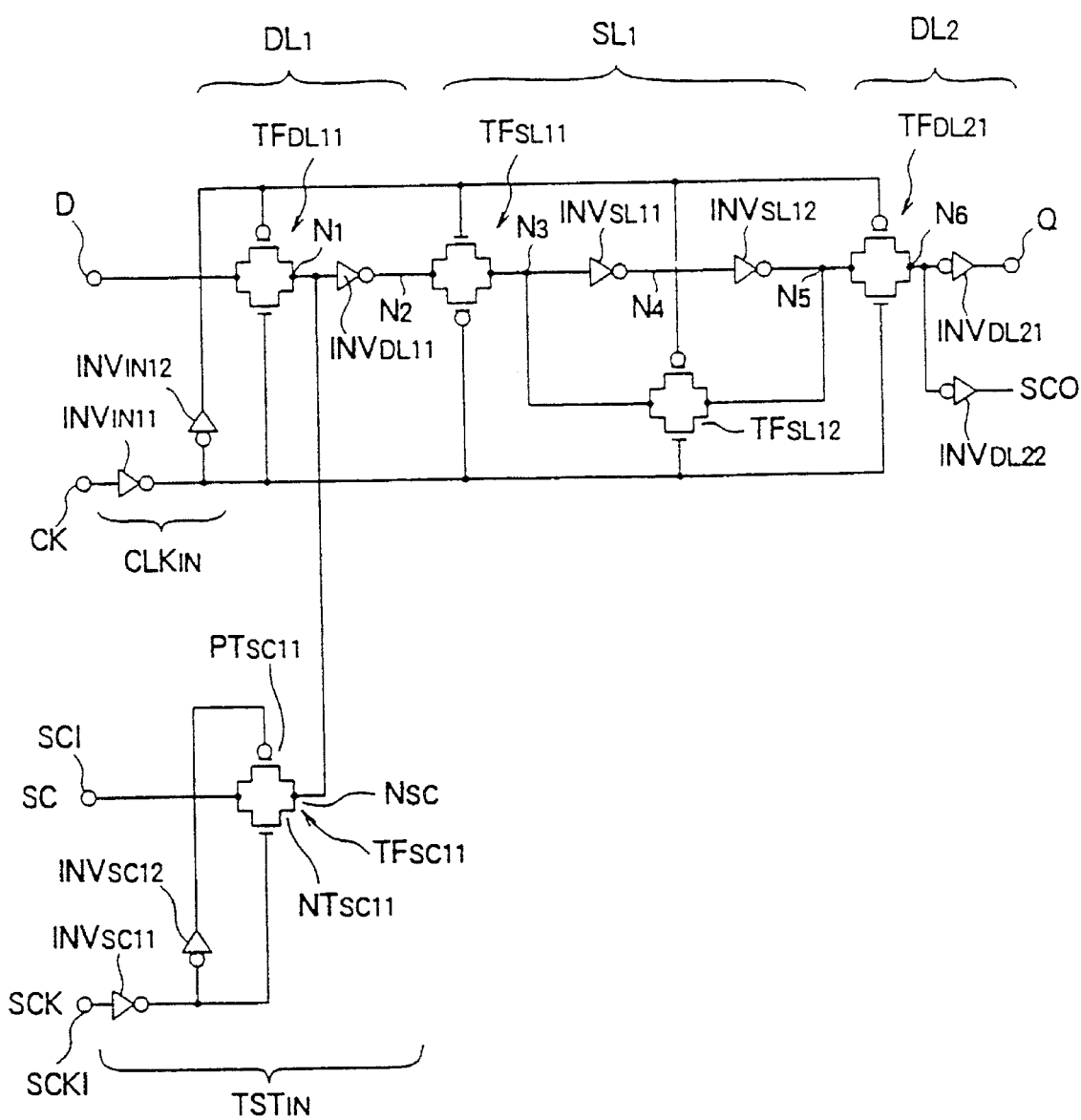
FIG. 17 is a circuit diagram of a ninth embodiment of a synchronizing circuit according to the present invention.

FIG. 17 is a circuit diagram of a ninth embodiment of a synchronizing circuit according to the present invention.

The point of difference of this embodiment from the seventh embodiment explained above lies in the provision of the scan output SCO in parallel to the Q-output.

The rest of the configuration is similar to that of the seventh embodiment.

By such a configuration, a similar effect can be obtained as with the effect of the above-mentioned seventh embodiment, of course, and there is the advantage that the Q-output is free from the effect of the scan path interconnections and therefore a higher speed system operation can be achieved.

10th Embodiment

Figure 18:
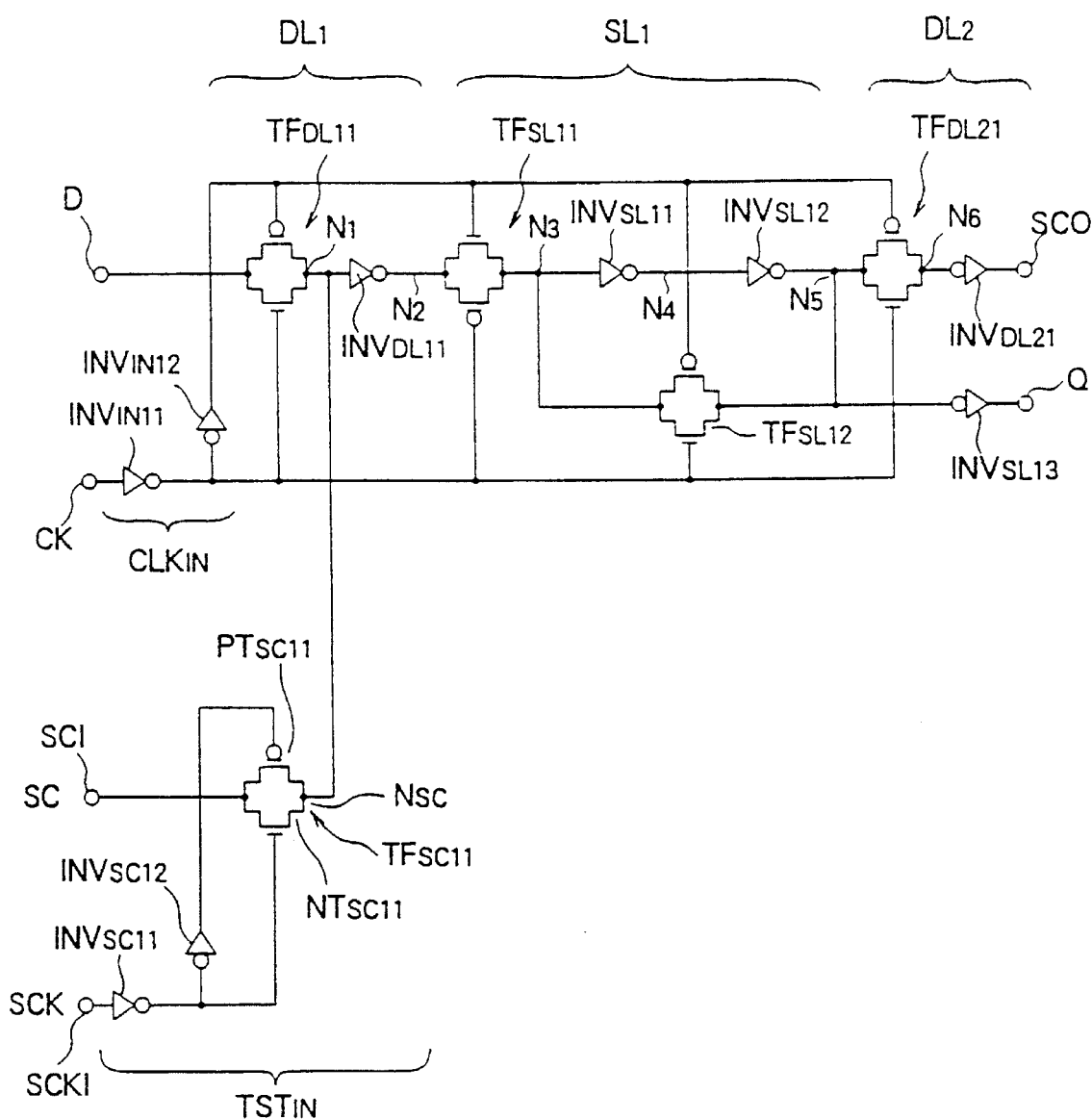
FIG. 18 is a circuit diagram of a 10th embodiment of a synchronizing circuit according to the present invention.

FIG. 18 is a circuit diagram of a 10th embodiment of a synchronizing circuit according to the present invention.

The point of difference of this embodiment from the seventh embodiment lies in the fact that the other input/output terminal of the transfer gate $TF_{SL12}$ of the static type through latch circuit SL1 is connected to the input of the inverter $INV_{SL13}$, the output of the inverter $INV_{SL13}$ is made the Q-output, and the output of the second dynamic type through latch circuit DL2 is made the scan output SCO.

In a synchronizing circuit of such a configuration, while the number of gates is reduced with respect to the Q-output at the time of the normal mode, no measures are taken against clock skew. As opposed to this, measures are taken against clock skew with respect to the scan output SCO at the time of the scan mode.

11th Embodiment

Figure 19:
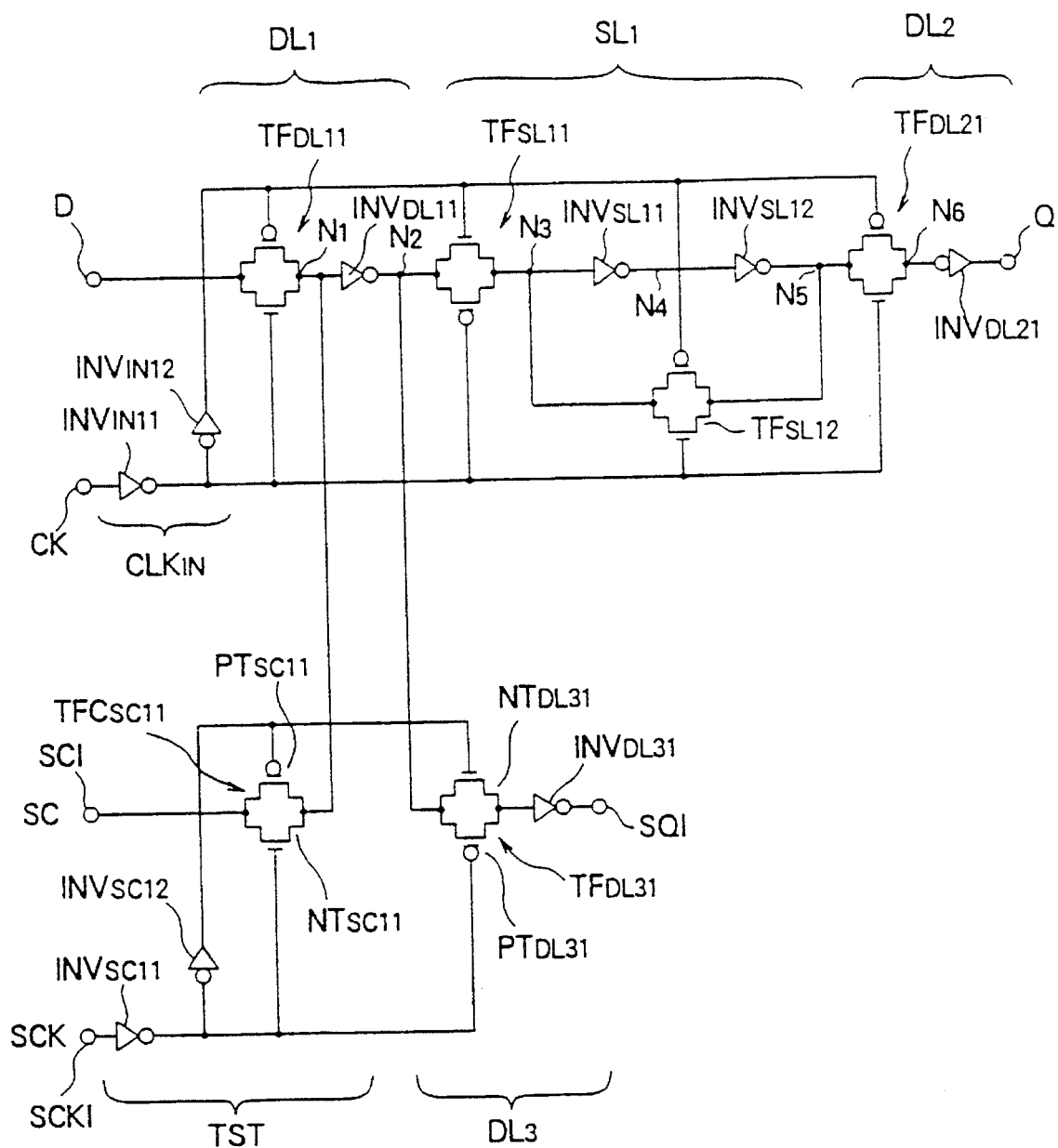
FIG. 19 is a circuit diagram of an 11th embodiment of a synchronizing circuit according to the present invention.

FIG. 19 is a circuit diagram of an 11th embodiment of a synchronizing circuit according to the present invention.

The point of difference of this embodiment from the seventh embodiment lies in the fact that a third dynamic type through latch circuit DL3 is connected in parallel to the static type through latch circuit SL1 for the output side node N2 of the inverter $INV_{DL11}$, i.e., the output of the first dynamic type through latch circuit DL1.

The third dynamic type through latch circuit DL3 is comprised of a transfer gate $TF_{DL31}$ and an inverter $INV_{DL31}$.

The transfer gate $TF_{DL31}$ is comprised of a p-channel MOS transistor $PT_{DL31}$ and an n-channel MOS transistor $NT_{DL31}$ with their sources and drains connected. As explained above, one of the input/output terminals is connected to the node N2 and the other input/output terminal is connected to the input terminal of the inverter $INV_{DL31}$. The gate of the n-channel MOS transistor $NT_{DL31}$ of the transfer gate $TF_{DL31}$ is connected to the output of the inverter $INV_{SC12}$ and the gate of the p-channel MOS transistor $PT_{DL31}$ is connected to the node of the output of the inverter $INV_{SC11}$, the gate of the n-channel MOS transistor $NT_{SC11}$ and the input of the inverter $INV_{SC12}$. The output of the inverter $INV_{SC12}$ is connected to the gate of the p-channel MOS transistor $PT_{SC11}$.

The operational modes of this synchronizing circuit $DSD_{sc}$ with this scan function are, like with the seventh embodiment, the normal mode and scan mode.

FIGS. 20A to 20E are timing charts in the normal mode, while FIGS. 21A to 21E are timing charts in the scan mode.

In the normal mode, the control scan clock signal SCK is fixed to the high level, while the transfer gate $TF_{SC11}$ is held in the nonconductive state and the transfer gate $TF_{DL31}$ is held in the conductive state. Accordingly, in the synchronizing circuit $DSD_{SC}$ with the scan function, a similar operation is performed as with the synchronizing circuit DSD shown in FIG. 3.

As opposed to this, in the scan mode, the clock pulse signal CKP is set to the high level, then the control scan clock signal SCK is switched from the high level to the low level. As a result, the D-input is isolated from the flipflop portion and the Q-output continues to output the value of the held charge.

Here, in this state, the scan data SC to the input terminal SCI is shifted to the output terminal SQI of the third dynamic type through latch circuit DL3.

Further, by switching the clock pulse signal CKP to the low level in the state of the scan clock signal SCK at the high level, the scan mode changes to the normal mode. At this time, for the first time, the Q-output is changed to a value input from the input terminal SCI just before.

As explained above, according to this embodiment, the scan operation can be realized with the output Q held as it is. Due to this, there is the advantage that a delay test between the flipflops becomes easier.

12th Embodiment

Figure 22:
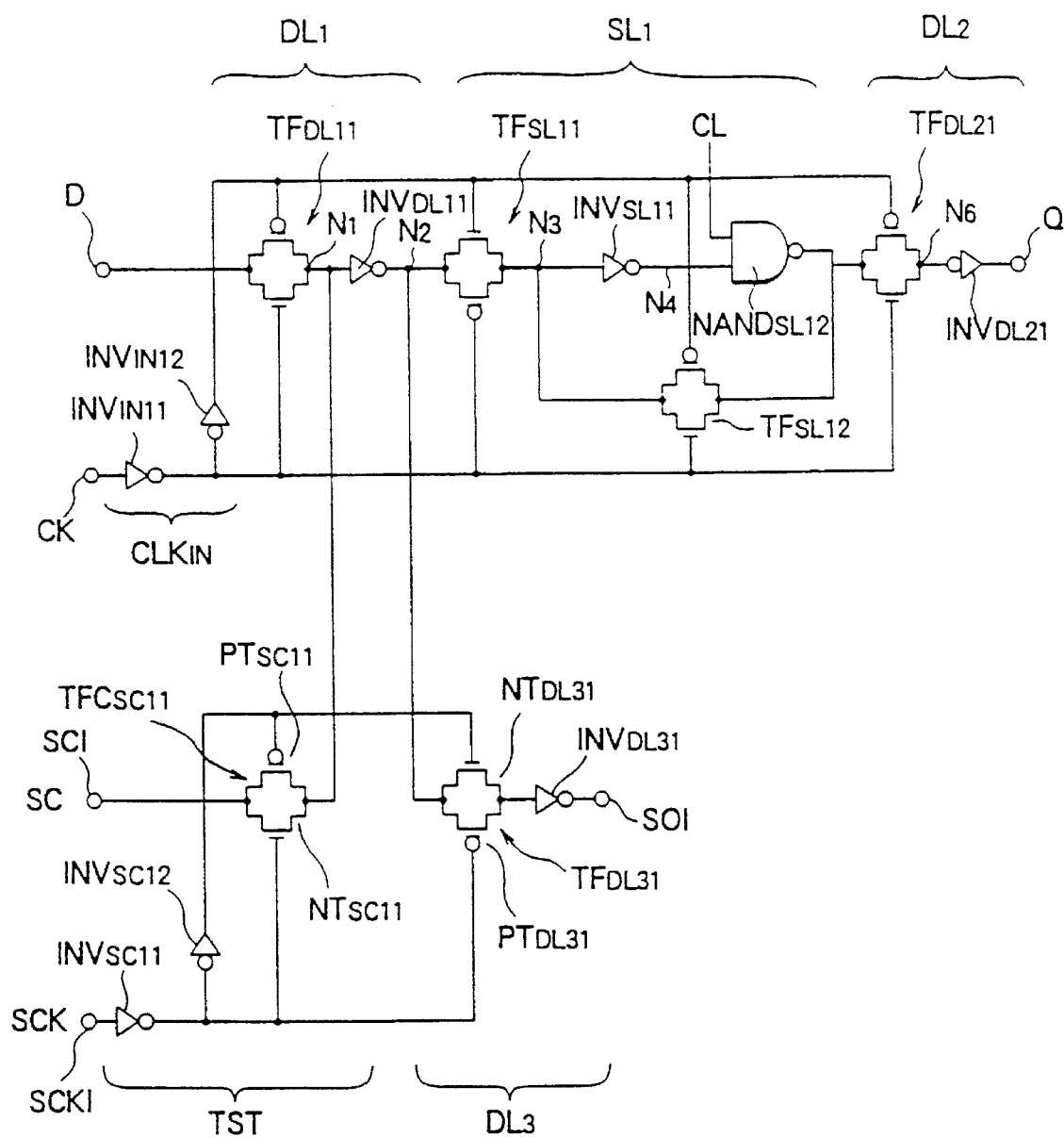
FIG. 22 is a circuit diagram of a 12th embodiment of a synchronizing circuit according to the present invention.

FIG. 22 is a circuit diagram of a 12th embodiment of a synchronizing circuit according to the present invention.

The point of difference between this embodiment and the 11th embodiment lies in the addition of a clear function.

Specifically, in the same way as in the second embodiment, instead of the inverter $INV_{SL12}$ in the static type through latch circuit SL1, provision is made of a two-input NAND circuit $NAND_{SL12}$. One input of the two-input NAND circuit $NAND_{SL12}$ is connected to the output of the inverter $INV_{SL11}$ and the other input is connected to the input terminal CL of the clear signal.

The rest of the configuration is the same as in the 11th embodiment explained above.

According to this embodiment, even if a clear signal is input as in the prior art, the scan operation will not be affected by it. Accordingly, there is no need to control the clear signal, so there is no restriction in the logical design and no increase in the area or reduction in speed is caused due to a control circuit.

13th Embodiment

Figure 23:
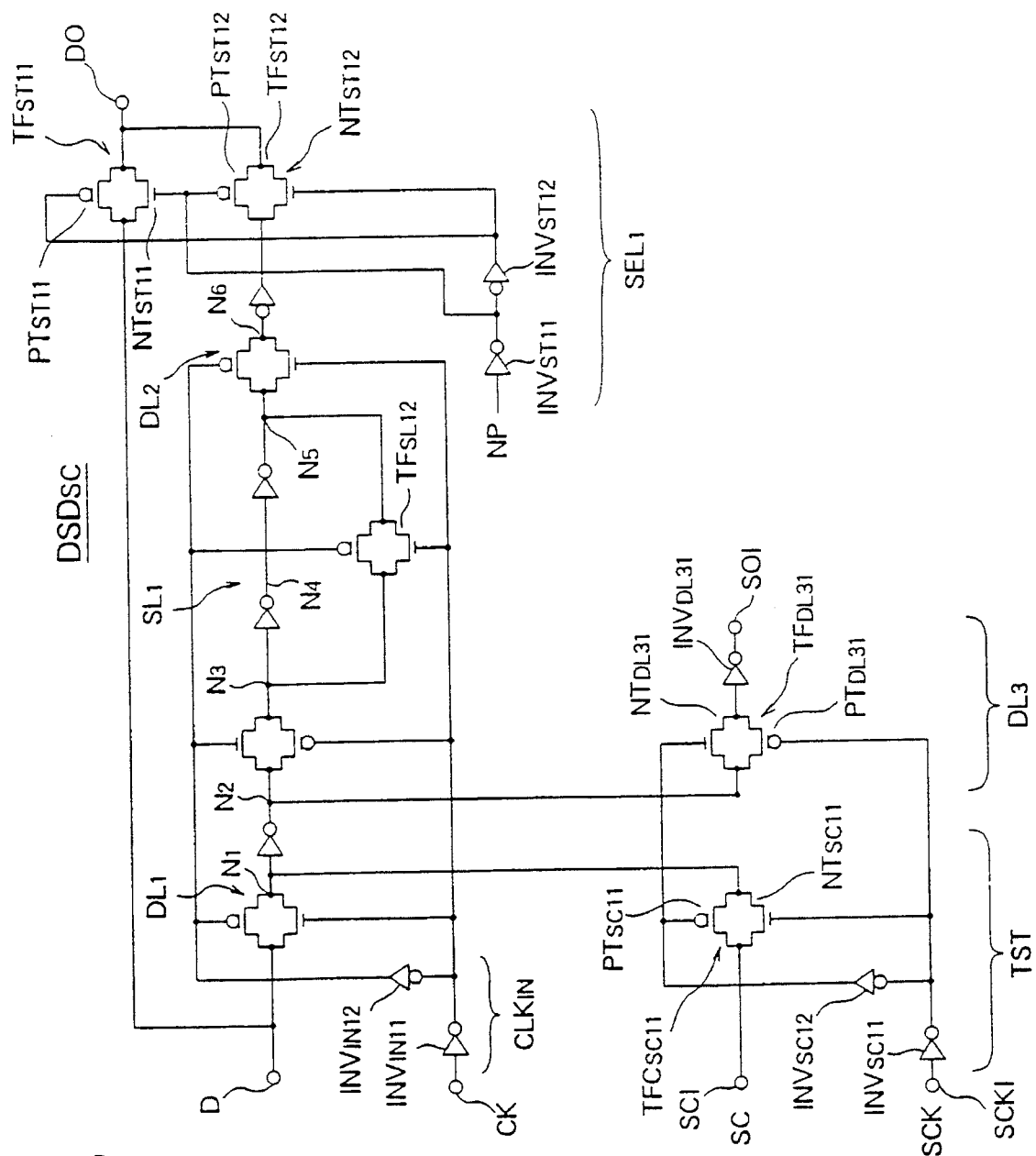
FIG. 23 is a circuit diagram of a 13th embodiment of a synchronizing circuit according to the present invention.

FIG. 23 is a circuit diagram of a 13th embodiment of a synchronizing circuit according to the present invention.

The point of difference of this embodiment from the above-mentioned 11th embodiment is that provision is made of a selection circuit SEL1 which selects and outputs one of the input data and the output data of the second dynamic type through latch circuit DL2, that is, the output of the flipflop, in accordance with the input of a control signal NP, and therefore a so-called boundary scan cell is constructed.

The selection circuit SEL1 is comprised of the transfer gates $TF_{ST11}$ and $TF_{ST12}$ and the inverters $INV_{ST11}$ and $INV_{ST12}$.

The specific connections are as follows: One input/output terminal of the transfer gate $TF_{ST11}$ is connected to the data input terminal D, while the other input/output terminal of the transfer gate $TF_{ST11}$ is connected to the output of the second dynamic type through latch circuit DL2 through transfer gate $TF_{ST12}$.

The transfer gate $TF_{ST11}$ is comprised by the p-channel MOS transistor $PT_{ST11}$ and the n-channel MOS transistor $NT_{ST11}$ with their sources and drains connected. The gate of the p-channel MOS transistor $PT_{ST11}$ is connected to the output of the inverter $INV_{ST12}$, while the gate of the n-channel MOS transistor $NT_{ST11}$ is connected to the node of the output of the inverter $INV_{ST11}$ and the input of the inverter $INV_{ST12}$.

Similarly, the transfer gate $TF_{ST12}$ is comprised by the p-channel MOS transistor $PT_{ST12}$ and the n-channel MOS transistor $NT_{ST12}$ with their sources and drains connected. The gate of the p-channel MOS transistor $PT_{ST12}$ is connected to the node of the output of the inverter $INV_{ST11}$ and the input of the inverter $INV_{ST12}$, while the gate of the n-channel MOS transistor $NT_{ST12}$ is connected to the output of the inverter $INV_{ST12}$.

The input of the inverter $INV_{ST11}$ is connected to the input line of the control clock signal NP.

Figure 24:
FIG. 24 is a view of the clock setting conditions of the circuit of FIG. 23 at the time of a normal, sampling, shift, and update mode.

As the operating modes of the synchronizing circuit $DSD_{SC}$ with the scan function, as shown in FIG. 24, there are a normal mode, sampling mode, shift mode, and update mode.

In the normal mode, the input data to the input terminal is output as it is through the transfer gate $TF_{ST11}$ of the selection circuit SEL1.

In the sampling mode, a latch operation of the input data is performed.

In the shift mode, the scan data SC to the input terminal SCI is shifted to the output terminal SOI of the third dynamic type through latch circuit DL3.

In the update mode, the value shifted to is output to the output terminal DO when the shift is completed through the transfer gate $TF_{ST12}$ of the selection circuit SEL1.

According to this embodiment, it is possible to realize a boundary scan function by fewer number of transistors than in the past.

14th Embodiment

Figure 25:
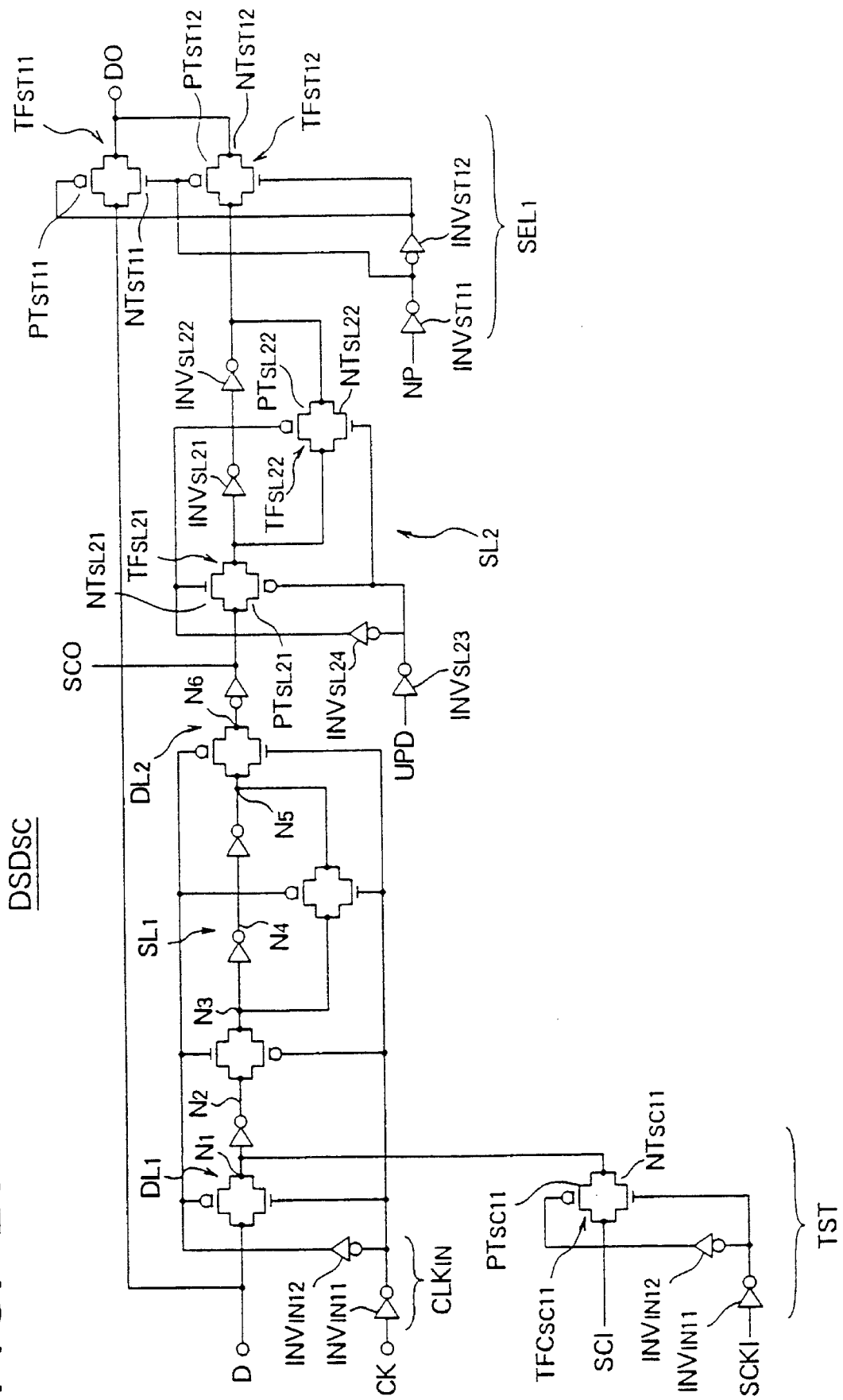
FIG. 25 is a circuit diagram of a 14th embodiment of a synchronizing circuit according to the present invention.
Figure 26:
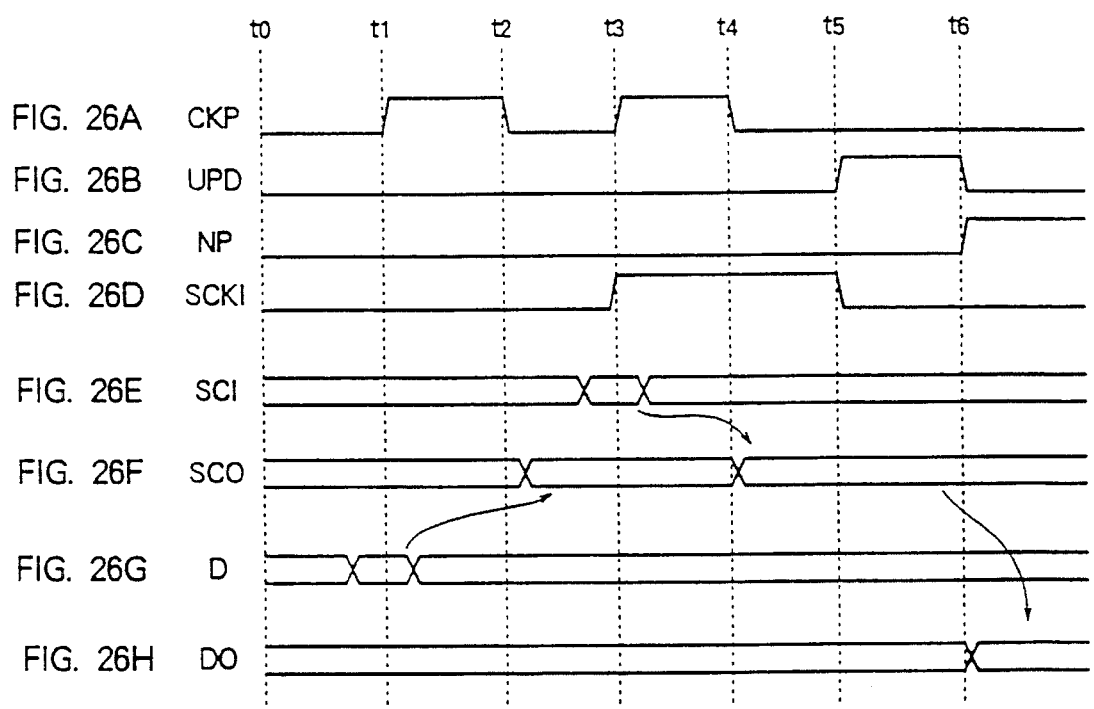
FIGS. 26A to 26H are timing charts for explaining the operation of the circuit of FIG. 25.

FIG. 25 is a circuit diagram of a 14th embodiment of a synchronizing circuit according to the present invention.

The point of difference of this embodiment from the 13th embodiment lies in the fact that a second static type through latch circuit SL2 is provided between the output of the second dynamic type through latch circuit DL2 and selection circuit SEL1 to construct a boundary scan cell which selects and outputs one of the input data and the output data of the second static type through latch circuit SL2 in accordance with the input of the control signal NP. Further, a scan output SCO is provided at the output of the second dynamic type through latch circuit DL2.

Note that the second static type through latch circuit SL2, like the static type through latch circuit SL1, is comprised of the transfer gates $TF_{SL21}$ and $TF_{SL22}$ and the series-connected inverters $INV_{SL21}$ and $INV_{SL22}$ and the inverters $INV_{SL23}$ and $INV_{SL24}$.

The specific connections are as follows: One of the input/output terminals of the transfer gate $TF_{SL21}$ is connected to the output of the second dynamic type through latch circuit DL2, while the other input/output terminal is connected to the input of the inverter $INV_{SL21}$ and one input/output terminal of the transfer gate $TF_{SL22}$. The node of the other input/output terminal of the transfer gate $TF_{SL22}$ and the output of the inverter $INV_{SL22}$ is connected to one input/output terminal of the transfer gate $TF_{ST12}$ of the selection circuit SEL1.

The gate of the p-channel MOS transistor $PT_{SL21}$ of the transfer gate $TF_{SL21}$ and the gate of the n-channel MOS transistor $NT_{SL21}$ of the transfer gate $TF_{SL22}$ are connected to the node of the output of the inverter $INV_{SL23}$ and the input of the inverter $INV_{SL24}$. Further, the gate of the n-channel MOS transistor $NT_{SL21}$ of the transfer gate $TF_{SL21}$ and the gate of the p-channel MOS transistor $PT_{SL22}$ of the transfer gate $TF_{SL22}$ are connected to the output of the inverter $INV_{SL24}$.

Further, the input of the inverter $INV_{SL23}$ is connected to the input line of the control signal UPD.

As the operating modes of the synchronizing circuit $DSD_{SC}$ with the scan function, as shown in FIG. 23, there are a normal mode, sampling mode, shift mode, and update mode. FIGS. 26A to 26H are timing charts of the operation of the circuit of FIG. 25.

For example, in the normal mode, when the signals CKP, SCKI, UPD, and NP are the low level, the data input to the input terminal D is output as it is through the transfer gate TF$_{ST11}$ of the selection circuit SEL1.

In the sampling mode, the clock signal CK is held at the high level for a predetermined time and then a latch operation is performed on the input data.

In the shift mode, the clock signal CKP is held at the high level for a predetermined time and at the same time the SCKI is held at the high level for a predetermined time and the scan data SC to the input terminal SCI is shifted to the static type through latch circuit SL1.

In the upgrade mode, when the clock signal is at the low level, the control signal UPD is set to the high level, the scan data output SCO is output from the second dynamic type through latch circuit DL2, and the shifted data is latched at the second static type through latch circuit SL2.

Next, the control signal NP is set to the high level and the data latched at the second static type through latch circuit SL2 is output to the output terminal DO through the transfer gate TF$_{ST12}$ of the selection circuit SEL1.

According to this embodiment, it is possible to realize a boundary scan test with a high reliability.

15th Embodiment

Figure 27:
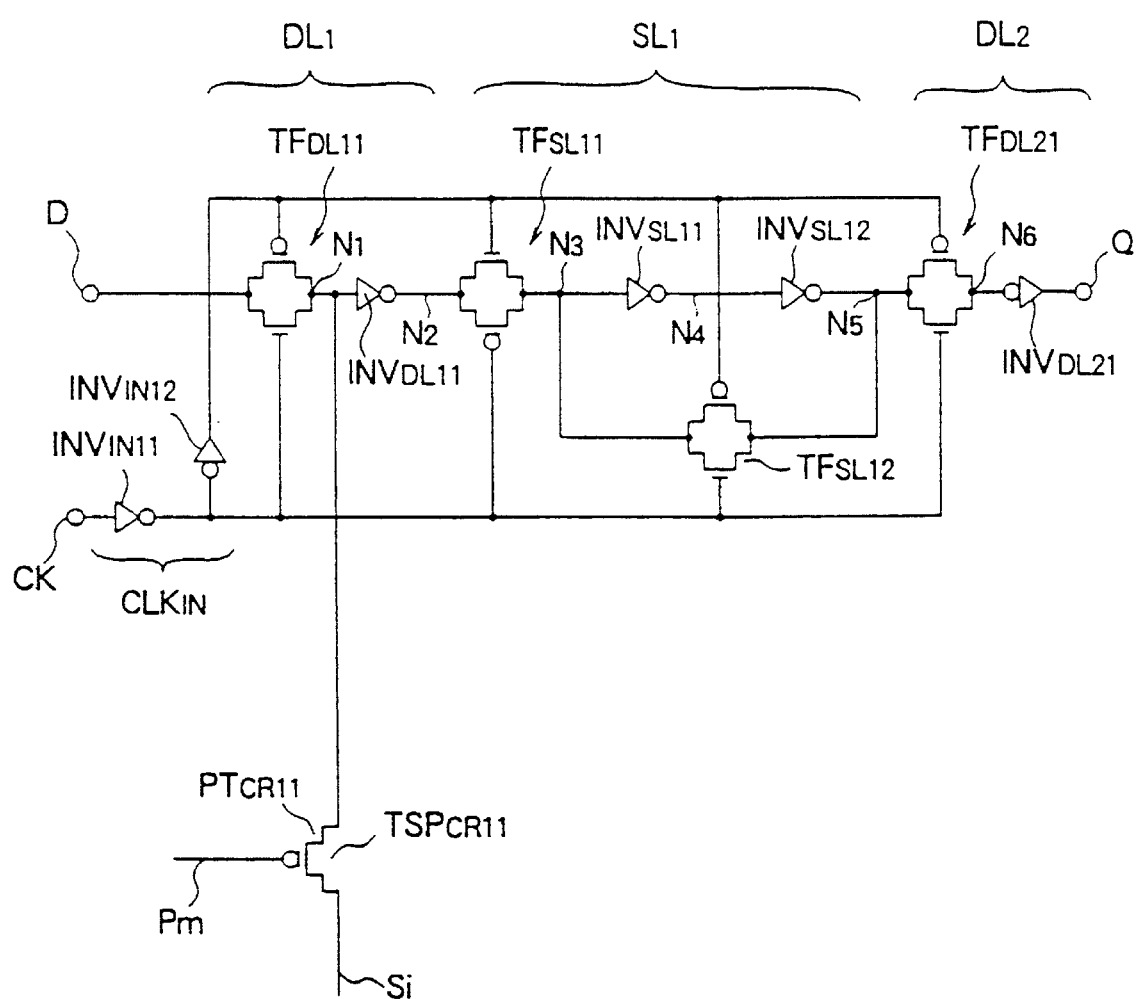
FIG. 27 is a circuit diagram of a 15th embodiment of a synchronizing circuit according to the present invention.

FIG. 27 is a circuit diagram of a 15th embodiment of a synchronizing circuit according to the present invention.

The point of difference of this embodiment from the first embodiment lies in the addition of a write function by the so-called grid based cross check test structures.

More specifically, at the other input/output terminal N1 of the transfer gate TF$_{DL11}$ of the first dynamic type through latch circuit DL1 there is connected a test point TSP$_{CR11}$ comprised of a p-channel MOS transistor PT$_{CR11}$ formed at the intersection of a probe line Pm and sense line Si which are formed by a cross check lattice configuration.

The test point TSP$_{CR11}$ is buried under the cross check configuration IC and does not increase the circuit area. Further, the test point TSP$_{CR11}$ is fabricated by a small transistor, so there is almost no effect on the operating speed of the synchronizing circuit.

The operational modes of the synchronizing circuit DSD$_{WR}$ with the write function are a normal mode and write mode.

FIGS. 28A to 28E are timing charts of the normal mode, while FIGS. 29A to 29E are timing charts of the write mode.

In the normal mode, the signal on the probe line Pm is fixed to the high level. Accordingly, in the synchronizing circuit DSD$_{WR}$ with the write function, a similar operation as the synchronizing circuit DSD shown in FIG. 3 is performed. At this time, as mentioned above, the test point TSP$_{CR12}$ is fabricated by a small transistor, so there is almost no effect on the operating speed of the synchronizing circuit.

As opposed to this, in the write mode, the clock pulse signal CKP is set to the high level, then the signal on the probe line Pm is switched from the high level to the low level. In this state, the value of the sense line Si is written in the flipflop. However, the value of the sense line Si is not output to the Q-output.

Next, the signal on the probe line Pm is switched from the low level to the high level and the clock pulse signal CKP is switched from the high level to the low level and the value of the sense line Si is conveyed to the Q-output.

This ends the series of steps of the write operation.

As explained above, according to this embodiment, a similar action and effect as the first embodiment can be obtained of course and also since just a test point is added, there is no increase in area and almost no reduction of the operating speed.

Further, since a write mode is realized by just a clock and a probe line, there is the advantage that the write control is simple.

16th Embodiment

Figure 30:
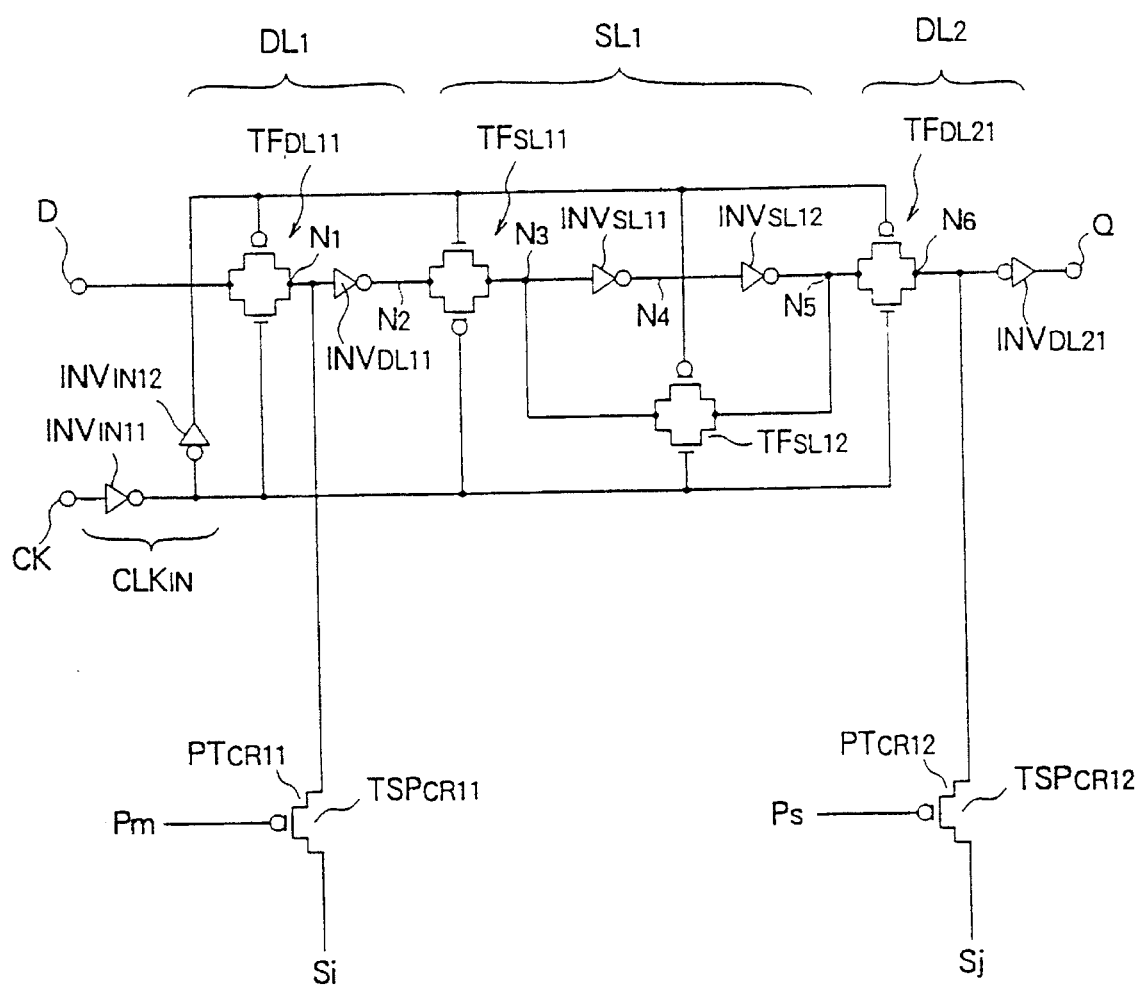
FIG. 30 is a circuit diagram of a 16th embodiment of a synchronizing circuit according to the present invention.

FIG. 30 is a circuit diagram of a 16th embodiment of a synchronizing circuit according to the present invention.

The point of difference of this embodiment from the 15th embodiment explained above lies in the addition of the delay test function by the so-called grid based cross check test structures.

Specifically, in addition to the configuration of FIG. 27, the other input/output terminal N6 of the transfer gate TF$_{DL21}$ of the second dynamic type through latch circuit DL2 has connected to it a test point TSP$_{CR12}$ comprised of a p-channel MOS transistor PT$_{CR12}$ fabricated at the intersection of the probe line Ps and sense line Sj of the cross check lattice configuration.

This test point TSP$_{CR12}$ is also buried under the crosscheck configuration IC and does not increase the area.

Further, the test point TSP$_{CR12}$ is fabricated from a small transistor, so there is almost no effect on the operating speed of the synchronizing circuit.

The operational modes of the synchronizing circuit DSD$_{WR}$ with the write function are a normal mode and delay test mode.

FIGS. 31A to 31G are timing charts of the normal mode, while FIGS. 32A to 32G are timing charts of the delay test mode.

In the normal mode, the signals on the probe lines Pm and Ps are fixed to the high level. Accordingly, in the synchronizing circuit DSD$_{WR}$ with the write function, a similar operation as the synchronizing circuit DSD shown in FIG. 3 is performed. At this time, as mentioned above, the test point TSP$_{CR12}$ is fabricated by a small transistor, so there is almost no effect on the operating speed of the synchronizing circuit.

In the write mode, the clock pulse signal CKP is set to the high level, then the signals on the probe lines Pm and Ps are switched from the high level to the low level. In this state, the value of the sense line Si is written in the synchronizing circuit and the inverted value of the sense line Sj is written in the Q-output.

Note that to perform the delay test, the signal on the line Si must be equal to the signal on the line Sj or else there will be no change in the signal of the Q-output.

Next, the signals on the probe lines Pm and Ps are switched from the low level to the high level and the clock pulse signal CKP is switched from the high level to the low level. Due to this, it is possible to cause a change in the signal at the Q-output.

Further, after the elapse of a suitable allowable delay time t$_{ALW}$, the clock pulse signal CKP is once again switched from the low level to the high level. Along with this, the value conveyed to the D-input can be obtained at the later stage D-flipflop. After this, the value is read out to the outside from the test point to the cross check configuration and the results of the delay time are referred to.

As explained above, according to this embodiment, a similar action and effect as the first embodiment can be obtained of course and also since just a test point is added, there is no increase in area and almost no reduction of the operating speed.

Note that in this embodiment, use was made of a test point comprised of a p-channel MOS transistor, but a similar action and effect may be obtained even if use is made of a test point comprised of an n-channel MOS transistor.

17th Embodiment

Figure 33:
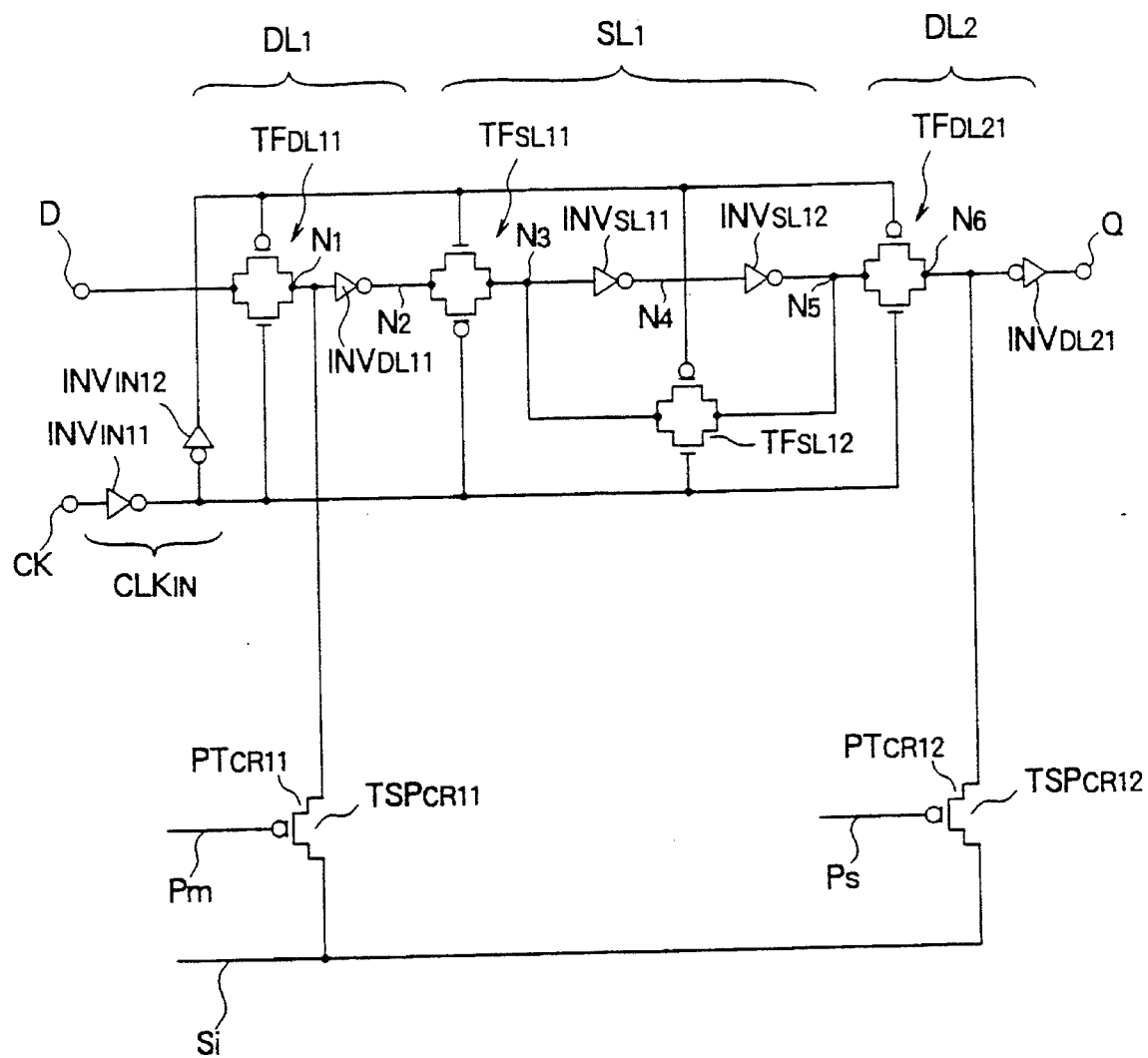
FIG. 33 is a circuit diagram of a 17th embodiment of a synchronizing circuit according to the present invention.

FIG. 33 is a circuit diagram of a 17th embodiment of a synchronizing circuit according to the present invention.

The point of difference of this embodiment from the 16th embodiment explained above lies in the fact that the sense line Sj has been eliminated and the two test points $TSP_{CR11}$ and $TSP_{CR12}$ are connected to the same sense line Si.

This is due to the fact that it is sufficient if Si equals Sj in order to change the Q-output for performing the delay test.

In such a configuration too, a similar effect can be obtained as in the 16th embodiment mentioned above.

Note that in this embodiment, use was made of a test point comprised of a p-channel MOS transistor, but a similar action and effect may be obtained even if use is made of a test point comprised of an n-channel MOS transistor.

As explained above, according to the present invention, it is possible to prevent malfunctions of an LSI due to a clock skew caused by deviations in timing of clock distribution.

Further, the layout at the time of the clock allocation becomes easy.

Further, since two of the three latches constituting the circuit are made dynamic types, the circuit can be realized by about the same number of gates as a conventional static type-D-type flipflop.

Further, despite the use of some dynamic latches, due to the joint use of a pulse generation circuit, there is no restriction on the minimum frequency of the original clock.

Further, when no pulse generation circuit is used, the maximum operating speed of the LSI becomes ½, so the reduction of the speed in the case of use of a pulse generation circuit is held to the rate of the output pulse width/clock period.

Further, it is easy to change from a design centered on the conventional D-type flipflop, mixture is possible, and dynamic inspection is easy.

Further, it is possible to realize a scan function by a small number of additional circuits, there is almost no reduction in the operating speed, and it is possible to prevent clock skew even in a scan operation.

Further, by provision of the third dynamic type latch circuit, it is possible to realize a scan operation with the output held as it is, so there is the advantage that a delay test among flipflops becomes easy.

Also, by connection of a test point of the cross check circuit, it is possible to realize a write operation and delay test operation. The test point can be fabricated by a small transistor, so there is no increase in the area caused and there is almost no reduction of the operating speed of the circuit.

What is claimed is:

1. A synchronizing circuit, having a data input terminal and a data output terminal, which operates in synchronization with a clock signal, comprising:

a latch circuit means for receiving from said data input terminal input data at a point of change from a first level of said clock signal to a second level of said clock signal and outputting data through said data output terminal at a point of change from the second level to the first level, wherein said latch circuit means consists of a first dynamic type latch circuit, a second dynamic type latch circuit, and a static type latch circuit, wherein said static type latch circuit is sandwiched between said first dynamic type latch circuit and said second dynamic type latch circuit, wherein said latch circuits are connected in cascade, and wherein an input of said first dynamic type latch circuit is coupled to said data input terminal and an output of said second dynamic type latch circuit is coupled to said data output terminal, and scanning means comprising a third dynamic type latch circuit connected in parallel with said static type latch circuit to the output of said first dynamic type latch circuit.

2. A synchronizing circuit as set forth in claim 1, wherein said static type latch circuit is provided with a clear signal input terminal and clears the data held therein by input of a clear signal.

3. A synchronizing circuit as set forth in claim 1, further comprising a selection circuit for selectively outputting the input data and the output data of said second dynamic type latch circuit in accordance with the input of a control signal to the selection circuit.

4. A synchronizing circuit as set forth in claim 1, wherein a circuit for performing a write operation and delay test operation is connected to said first dynamic type latch circuit.

5. A synchronizing circuit as set forth in claim 4, wherein said circuit for performing the write operation and delay test operation comprises a transistor provided between a data holding node of said first dynamic type latch circuit and a sense line, and a gate of said transistor is connected to a probe line.

6. A synchronizing circuit as set forth in claim 1, wherein a circuit for performing a write operation and delay test operation is connected to said second dynamic type latch circuit.

7. A synchronizing circuit as set forth in claim 6, wherein said circuit for performing the write operation and delay test operation comprises a transistor provided between a data holding node of said second dynamic type latch circuit and a sense line, and a gate of said transistor is connected to a probe line.

8. A synchronizing circuit, having a data input terminal and a data output terminal, which operates in synchronization with a clock signal, comprising:

a latch circuit means for receiving from said data input terminal input data at a point of change from a first level of said clock signal to a second level of said clock signal and outputting data through said data output terminal at a point of change from the second level to the first level, wherein said latch circuit means consists of a first dynamic type latch circuit, a second dynamic type latch circuit, and a static type latch circuit, wherein said static type latch circuit is sandwiched between said first dynamic type latch circuit and said second dynamic type latch circuit, wherein said latch circuits are connected in cascade, wherein an input of said first dynamic type latch circuit is coupled to said data input terminal and an output of said second dynamic type latch circuit is coupled to said data output terminal, and wherein said static type latch circuit is provided with a clear signal input terminal and clears data held in said static type latch when a clear signal is applied to said clear signal input terminal.

9. A synchronizing circuit, having a data input terminal and a data output terminal, which operates in synchronization with a clock signal, comprising:

a latch circuit means for receiving from said data input terminal input data at a point of change from a first level of said clock signal to a second level of said clock signal and outputting data through said data output terminal at a point of change from the second level to the first level, wherein said latch circuit means consists of a first dynamic type latch circuit, a second dynamic type latch circuit, and a static type latch circuit, wherein said static type latch circuit is sandwiched between said first dynamic type latch circuit and said second dynamic type latch circuit, wherein said latch circuits are connected in cascade, and wherein an input of said first dynamic type latch circuit is coupled to said data input terminal and an output of said second dynamic type latch circuit is coupled to said data output terminal, and a selection circuit for selectively outputting the input data and the output data of said second dynamic type latch circuit in accordance with the input of a control signal to the selection circuit.

* * * * *